United States Patent
Park et al.

(10) Patent No.: US 8,809,929 B2
(45) Date of Patent: Aug. 19, 2014

(54) MICROELECTRONIC MEMORY DEVICES HAVING FLAT STOPPER LAYERS

(71) Applicant: Samsung Electronics Co., Ltd., Suwon-si (KR)

(72) Inventors: Wonmo Park, Seongnam-si (KR); Hyunchul Kim, Seoul (KR); Hyodong Ban, Suwon-si (KR); Hyunju Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/016,912

(22) Filed: Sep. 3, 2013

(65) Prior Publication Data

US 2014/0015028 A1    Jan. 16, 2014

Related U.S. Application Data

(62) Division of application No. 13/117,743, filed on May 27, 2011, now Pat. No. 8,530,324.

(30) Foreign Application Priority Data

Aug. 13, 2010  (KR) .................. 10-2010-0078486

(51) Int. Cl.
*H01L 27/108* (2006.01)
*H01L 49/02* (2006.01)
*H01L 21/205* (2006.01)

(52) U.S. Cl.
CPC ............ *H01L 27/108* (2013.01); *H01L 21/205* (2013.01); *H01L 27/10817* (2013.01); *H01L 27/10852* (2013.01); *H01L 27/10894* (2013.01); *H01L 28/91* (2013.01)
USPC ...... 257/296; 257/297; 257/298; 257/E21.66; 257/E21.651; 438/254; 438/397; 365/148; 365/149

(58) Field of Classification Search
CPC ............ H01L 27/108; H01L 27/10817; H01L 27/10852; H01L 28/91; H01L 27/10894; H01L 28/84; H01L 28/90; H01L 21/205
USPC ............ 257/296, 297, 298, E21.66, E21.651; 438/397, 254; 365/148, 149
See application file for complete search history.

(56) References Cited

U.S. PATENT DOCUMENTS

| | | |
|---|---|---|
| 6,010,933 A | 1/2000 | Cherng |
| 6,451,651 B1 | 9/2002 | Park et al. |
| 6,924,192 B2 | 8/2005 | Takeuchi |
| 8,148,223 B2 | 4/2012 | Lin et al. |
| 2002/0047201 A1 | 4/2002 | Suzuki |
| 2003/0153142 A1* | 8/2003 | Thakur et al. ............... 438/200 |
| 2005/0153518 A1 | 7/2005 | You et al. |

* cited by examiner

*Primary Examiner* — Thinh T Nguyen
(74) *Attorney, Agent, or Firm* — Myers Bigel Sibley & Sajovec, P.A.

(57) ABSTRACT

Memory devices comprise a lower layer that extends across a cell array region and across a peripheral region and that includes a flat outer surface from the cell array region to the peripheral region. A signal transfer conductor layer extends in the cell array region beneath the flat outer surface of the lower layer and extends in the peripheral region above the flat outer surface of the lower layer. An insulating layer is provided on the lower layer, including a flat outer surface from the cell array region to the peripheral region. A flat stopper layer is provided on the flat outer surface of the insulating layer and extending across the cell array region and the peripheral region. Related methods are also provided.

22 Claims, 18 Drawing Sheets

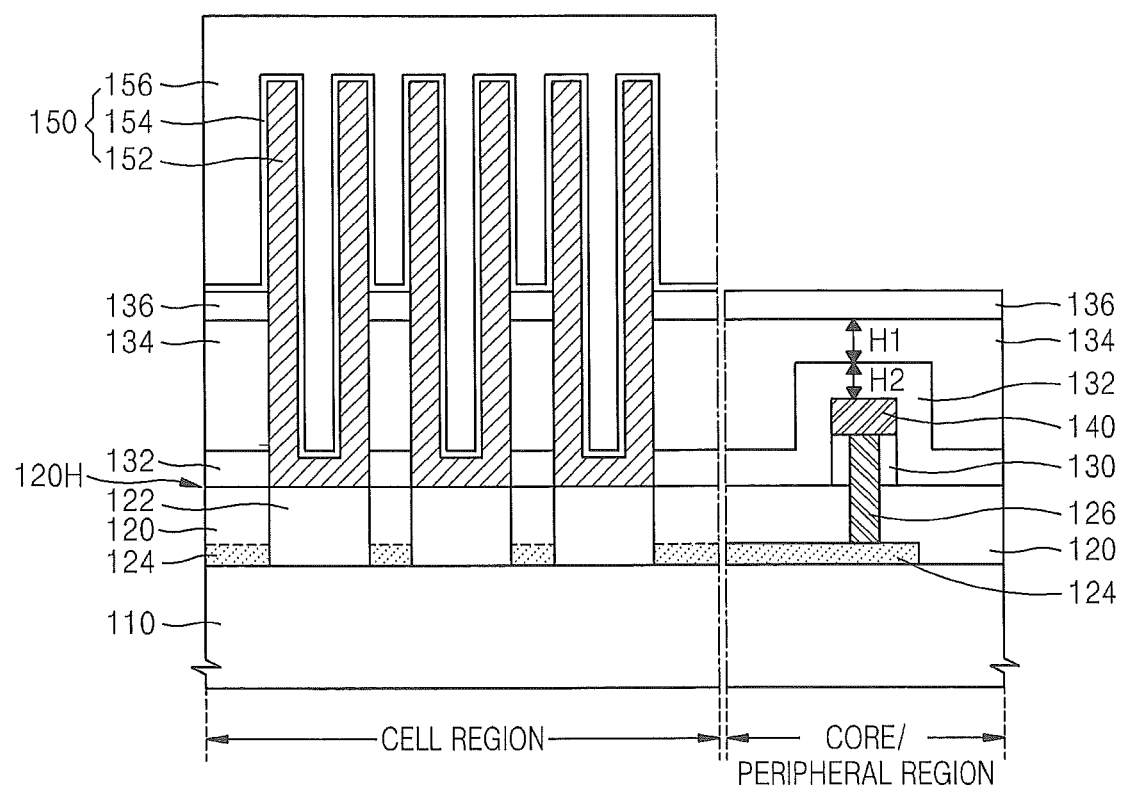

MICROELECTRONIC MEMORY DEVICES HAVING FLAT STOPPER LAYERS

CROSS-REFERENCE TO RELATED APPLICATIONS

This application is a divisional of application Ser. No. 13/117,743, filed May 27, 2011, which itself claims the benefit of Korean Patent Application No. 10-2010-0078486, filed on Aug. 13, 2010, in the Korean Intellectual Property Office, the disclosures of both of which are incorporated herein in their entirety by reference.

BACKGROUND

One or more aspects of the inventive concept relate to microelectronic memory devices and methods of fabricating the same, and more particularly, to microelectronic memory devices including a capacitor in a cell array region, and a signal transfer conductive layer in a cell array region and a core/peripheral region and methods of fabricating the same.

Microelectronic memory devices may be divided into a cell array region and a core/peripheral region. In the cell array region, a cell array including a plurality of unit memory cells arranged in a matrix to store data is formed. In the core/peripheral region also referred to as a "peripheral region", a plurality of peripheral circuits are formed so as to transmit data from the outside to the cell array region or transmit data from the cell array region to the outside.

SUMMARY

Memory devices according to various embodiments described herein comprise a microelectronic substrate including a cell array region and a peripheral region adjacent the cell array region, the cell array region including therein an array of memory cells and the peripheral region including therein a plurality of peripheral circuits for the array of memory cells, the microelectronic substrate including a lower layer that extends across the cell array region and across the peripheral region and that includes a flat outer surface from the cell array region to the peripheral region. A signal transfer conductor layer extends in the cell array region beneath the flat outer surface of the lower layer and extends in the peripheral region above the flat outer surface of the lower layer. An insulating layer is provided on the lower layer, the insulating layer extending across the cell array region and the peripheral region and also including a flat outer surface from the cell array region to the peripheral region. A flat stopper layer is provided on the flat outer surface of the insulating layer and extending across the cell array region and the peripheral region. Finally, an array of memory cell capacitor storage nodes is provided in the cell array region that extend beyond the flat stopper layer and that penetrate through the flat stopper layer and the insulating layer.

In other embodiments, a stepped stopper layer is also provided that extends along the cell array region on the outer surface of the lower layer and that extends onto the signal transfer conductor layer in the peripheral region. In some embodiments, a portion of the stepped stopper layer that extends onto the signal transfer conductor layer in the peripheral region directly contacts the flat stopper layer. In other embodiments, the stepped stopper layer extends onto sidewalls of the signal transfer conductor layer in the peripheral region but not onto an outer surface of the signal transfer layer in the peripheral region and the flat stopper layer extends directly on the outer surface of the signal transfer layer.

In other embodiments, the signal transfer layer further comprises a plurality of contact plugs, a respective one of which connects a respective portion of the signal transfer conductor layer that extends in the cell array region to a respective portion of the signal transfer conductor layer that extends in the peripheral region. Moreover, in some embodiments, a respective signal transfer conductor layer in the peripheral region is wider than a respective contact plug that is connected thereto, the memory device further comprising a layer that extends along a sidewall of the respective contact plug to an underside of the respective signal transfer conductor layer in the peripheral region.

In still other embodiments, portions of the array of memory cell capacitor storage nodes that extend beyond the insulating layer are of cylindrical shape and portions of the array of memory cell capacitor storage nodes that penetrate through the flat stopper layer and the insulating layer are of concave shape.

Yet other embodiments include a plurality of buried contacts, a respective one of which connects a lower surface of a memory cell capacitor storage electrode with the signal transfer conductor layer in the cell array region.

In some embodiments, the signal transfer conductor layer that extends in the cell array region comprises a plurality of cell array region bit lines and the signal transfer conductor layer that extends in the peripheral region comprises a plurality of peripheral region bit lines. In other embodiments, the signal transfer conductor layer extends in the cell array region comprises a plurality of cell array region word lines and the signal transfer conductor layer that extends in the peripheral region comprises a plurality of peripheral region word lines.

Memory devices according to still other embodiments described herein comprise a microelectronic substrate including a cell array region and a peripheral region adjacent the cell array region, the cell array region including therein an array of memory cells, a respective one of which includes at least one transistor and at least one capacitor, and the peripheral region including therein a plurality of peripheral circuits for the array of memory cells. An interlayer insulating layer is provided on the semiconductor substrate that extends across the cell array region and across the peripheral region and that includes a flat outer surface from the cell array region to the peripheral region. A third contact layer is provided in the cell array region, and electrically connected to a first source/drain region of the at least one transistor. A cell array bit line is electrically connected to a second source/drain region of the at least one transistor in the cell array region. A peripheral bit line is provided on the outer surface of the interlayer insulating layer in the core/peripheral region, remote from the microelectronic substrate, and electrically connected to the cell array bit line. An insulating layer is provided between the peripheral bit line and the interlayer insulating layer in a pattern corresponding to the peripheral bit line. A stepped stopper layer extends along the cell array region on the interlayer insulating layer and that extends along the peripheral region on the interlayer insulating layer and on the peripheral bit line. An insulating molding layer is provided on the stepped stopper layer, the insulating molding layer extending across the cell array region and the peripheral region and also including a flat outer surface from the cell array region to the peripheral region. A flat stopper layer is provided on the insulating molding layer. Finally, a storage electrode of the at least one capacitor is provided, which is connected to the buried contact layer while passing through the stepped stopper layer, the insulating molding layer and the flat stopper layer.

In some embodiments, a lower surface of the peripheral bit line is farther from the substrate than a lower surface of the storage electrode. In other embodiments, the flat stopper layer and the stepped stopper layer directly contact each other over the peripheral bit line. In other embodiments, the peripheral bit line and the stepped stopper layer directly contact each other. In yet other embodiments, the storage electrode has a cylindrical shape on the flat stopper layer and a concave shape between the stepped stopper layer and the flat stopper layer.

Still other embodiments provide methods of fabricating a memory device. These methods comprise forming in a cell array region of a microelectronic substrate, a cell signal transfer conductor layer and a lower layer on the cell signal transfer conductor layer, the lower layer including a flat outer surface that extends onto a peripheral region of the substrate; forming a dielectric layer on the flat outer surface of the lower layer in the cell array region and in the peripheral region; and forming a peripheral signal transfer conductor layer on the dielectric layer in the peripheral region. These methods further comprise etching the dielectric layer in the cell array region and in the peripheral region using the peripheral signal transfer conductor layer as an etch mask; forming an insulating layer on the flat outer surface of the lower layer in the cell array region and extending on the flat outer surface of the lower layer in the peripheral region and on the peripheral signal transfer conductor layer, the insulating layer having a flat outer surface from the cell array region to the peripheral region; forming a flat stopper layer on the flat outer surface of the insulating layer and extending across the cell array region and the peripheral region; and forming an array of memory cell capacitor storage nodes in the cell array region that extend beyond the insulating layer and that penetrate through the flat stopper layer and the insulating layer.

In some embodiments, the following is performed between the etching the dielectric layer and the forming an insulating layer: forming a stepped stopper layer that extends along the cell array region on the outer surface of the dielectric layer and that extends onto the peripheral signal transfer conductor layer. Moreover, forming an insulating layer comprises forming an insulating layer on the stepped stopper layer in the cell array region and extending on the stepped stopper layer in the peripheral region, the insulating layer having a flat outer surface from the cell array region to the peripheral region.

In other embodiments, the following is performed between forming an insulating layer and forming a flat stopper layer: planarizing the insulating layer to expose the peripheral signal transfer conductor layer. Moreover, forming a flat stopper layer comprises forming a flat stopper layer on the flat outer surface of the insulating layer and extending across the cell array region and the peripheral region to directly contact the peripheral signal transfer conductor layer that has been exposed.

In still other embodiments, the following is performed after the forming an insulating layer: planarizing the insulating layer to expose the stepped stopper layer that extends onto the peripheral signal transfer conductor layer. Moreover, forming a flat stopper layer comprises forming a flat stopper layer on the flat outer surface of the insulating layer that has been planarized and extending across the cell array region and the peripheral region and directly contacting the stepped stopper layer that has been exposed.

In still other embodiments, the following is performed after the forming an insulating layer: planarizing the insulating layer to remove the stepped stopper layer that extends onto the peripheral signal transfer conductor layer to expose the peripheral signal transfer conductor layer. Moreover, forming a flat stopper layer comprises forming a flat stopper layer on the flat outer surface of the insulating layer that has been planarized and extending across the cell array region and the peripheral region and directly contacting the peripheral signal transfer conductor layer that has been exposed.

Yet other embodiments provide other methods of fabricating memory devices. In these methods, a microelectronic substrate is provided that comprises a cell array region and a peripheral region adjacent the cell array region, the cell array region including therein an array of memory cells, a respective one of which includes at least one transistor and at least one capacitor, and the peripheral region including therein a plurality of peripheral circuits for the array of memory cells; an interlayer insulating layer on the microelectronic substrate, that extends across the cell array region and across the peripheral region and that includes a flat outer surface from the cell array region to the peripheral region; a buried contact layer in the interlayer insulating layer in the cell array region, and electrically connected to a first source/drain region of the at least one transistor; and a cell array bit line that is electrically connected to a second source/drain region of the at least one transistor in the cell array region. These methods further comprise forming an insulating layer on the flat outer surface of the interlayer insulating layer; forming a peripheral bit line on the flat outer surface of the interlayer insulating layer in the peripheral region, remote from the microelectronic substrate; and patterning the insulating layer using the peripheral bit line as an etch mask. These methods further comprise forming a stepped stopper layer that extends along the cell array region on the interlayer insulating layer and that extends along the peripheral region on the interlayer insulating layer and on the peripheral bit line; forming an insulating molding layer on the stepped stopper layer, the insulating molding layer extending across the cell array region and the peripheral region and also including a flat outer surface from the cell array region to the peripheral region; forming a flat stopper layer on the insulating molding layer; and forming a storage electrode of the at least one capacitor, which is connected to the buried contact layer while passing through the stepped stopper layer, the insulating molding layer, and the flat stopper layer.

In some embodiments, the following is performed after the forming of an insulating molding layer: planarizing the insulating molding layer to expose the stepped stopper layer that extends onto the peripheral bit line. Moreover, forming a flat stopper layer comprises forming a flat stopper layer on the flat outer surface of the insulating molding layer that has been planarized and extending across the cell array region and the peripheral region and directly contacting the stepped stopper layer that has been exposed. In other embodiments, the following is performed after the forming an insulating molding layer: planarizing the insulating molding layer to remove the stepped stopper layer that extends onto the peripheral bit line to expose the peripheral bit line. Moreover, a flat stopper layer comprises forming a flat stopper layer on the flat outer surface of the insulating molding layer that has been planarized and extending across the cell array region and the peripheral region and directly contacting the peripheral bit line that has been exposed.

BRIEF DESCRIPTION OF THE DRAWINGS

Various embodiments of the inventive concept will be more clearly understood from the following detailed description taken in conjunction with the accompanying drawings in which:

FIG. 3 is a cross-sectional view partially illustrating a memory device according to various embodiments of the inventive concept;

DETAILED DESCRIPTION OF THE EMBODIMENTS

Figure 1A:
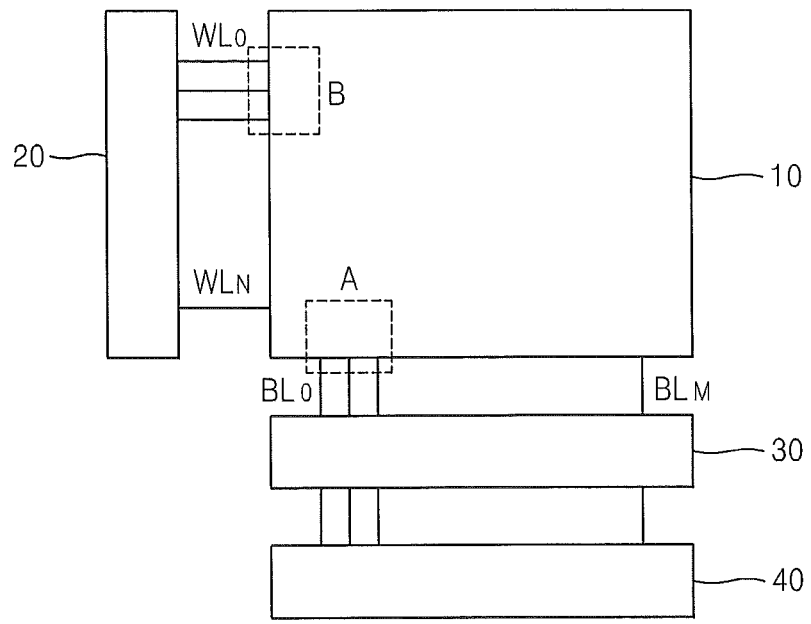
FIG. 1A is a schematic block diagram of a conventional memory device.

Hereinafter, various embodiments of the inventive concept will be described in detail with reference to the accompanying drawings. This inventive concept may, however, be embodied in many different forms and should not be construed as being limited to the embodiments set forth herein. Rather, these embodiments are provided so that this disclosure will be thorough and complete and will fully convey the inventive concept to those of ordinary skill in the art. The same reference numerals represent the same elements throughout the drawings unless specified otherwise. In the drawings, the thickness of layers and regions may be exaggerated for clarity. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it can be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it can be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms may be used herein to describe one element's relationship to another element as illustrated in the Figures. These relative terms generally relate to an element's position relative to a substrate, when the substrate is at the bottom of a drawing. However, it will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below", "beneath" or "under" other elements would then be oriented "above" or "over" the other elements. The exemplary terms "below", "beneath", "under" "above" and "over" can, therefore, encompass both an orientation of above and below. Also, the terms "horizontal" and "vertical," and the terms "x", "y" and "z" are used herein to describe generally orthogonal directions and do not imply a specific orientation.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Figure 1B:
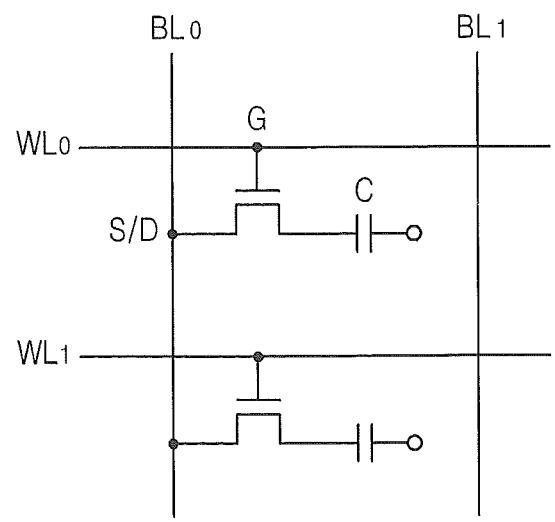
FIG. 1B is a schematic circuit diagram of a conventional memory cell included in a cell array region of FIG. 1A.

FIG. 1A is a schematic block diagram of a conventional microelectronic memory device. FIG. 1B is a schematic circuit diagram of a memory cell included in a cell array region of FIG. 1A.

The inventive concept may be applied to various types of memory devices, each basically including a unit cell having at least one transistor and at least one capacitor for storing data. Referring to FIGS. 1A and 1B, the memory device includes a cell array region (or cell region) 10, in which a plurality of unit memory cells for storing (memorizing) data are arranged in a matrix. In a core/peripheral region (or peripheral region) disposed adjacent to the cell array region 10, peripheral circuits are formed so as to transmit data to a storage device included in the cell array region 10 or transmit data from the storage device in the cell array region 10 to the outside.

In detail, the cell array region 10 includes the plurality of unit memory cells for storing and retaining data, and includes a plurality of word lines $WL_0, \ldots$ through to $WL_N$ that are signal lines for selecting and activating the plurality of unit memory cells, respectively, and a plurality of bit lines $BL_0, \ldots$ through to $BL_M$ that are signal lines for supplying data to or outputting data from the plurality of unit memory cells are received or transmitted, respectively.

Referring to FIG. 1B, the memory device may have a 1-T DRAM (1-Transistor Dynamic Random Access Memory) structure, in which each of the plurality of unit memory cells has one cell transistor and one capacitor C. It may be understood that data '1' is stored when electric charges are stored in the capacitor C and data '0' is stored when no electric charges are stored in the capacitor C. A storage electrode of the capacitor C is connected to a second source/drain region of the cell transistor that acts as a switch so that data may be stored therein or may be erased therefrom when the cell transistor is switched on or off. The word line $WL_0$ is connected to a gate G of the cell transistor and the bit line $BL_0$ is connected to a first source/drain source S/D of the cell transistor.

Referring to FIG. 1A, in the core/peripheral region adjacent to the cell array region 10, a row decoder 20 is formed to select a word line from among the plurality of word lines $WL_0, \ldots$, through to $WL_N$, and a column decoder 40 is formed to select a bit line from among the plurality of bit lines $BL_0, \ldots$, through to $BL_M$. Also, since each of the unit memory cells does not have an amplification function, a sense amplifier (SA) 30 is installed so as to sense and amplify a signal of the selected bit line and transmit the amplified signal to an external circuit. In FIG. 1A, reference numeral 'A' denotes a part of a border region between the plurality of bit lines $BL_0, \ldots$, through to $BL_M$ and the cell array region 10, and reference numeral 'B' denotes a part of a border region the plurality of word lines $WL_0, \ldots$, through to $WL_N$ and the cell array region 10.

Figure 2:
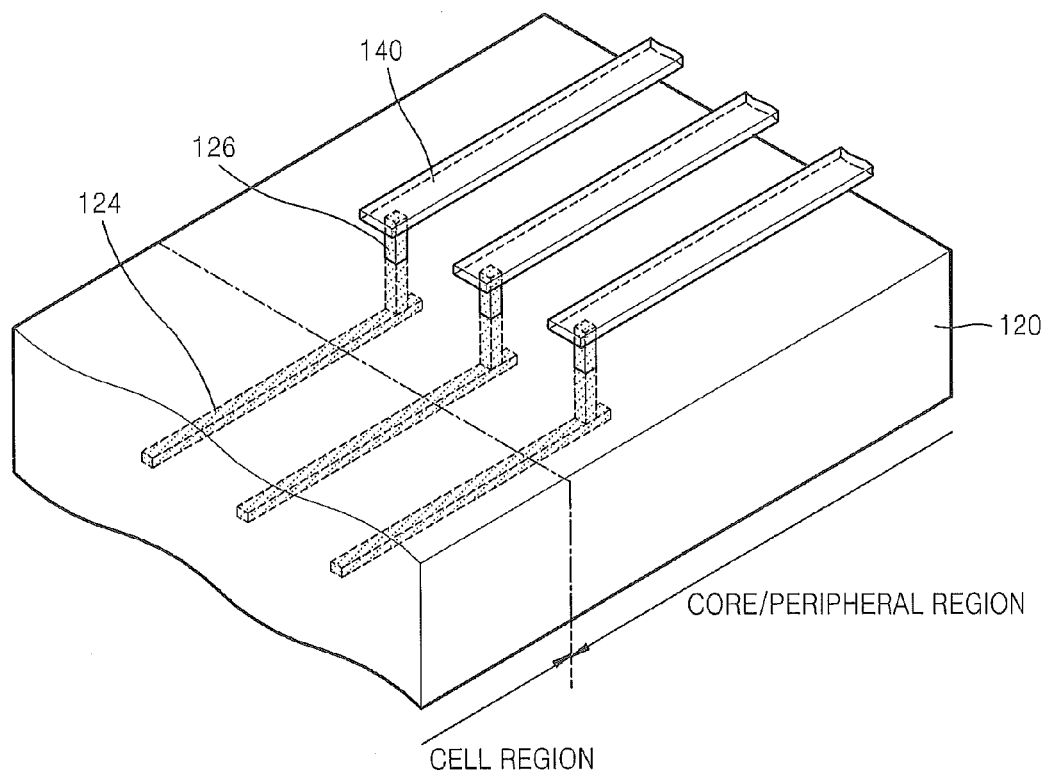
FIG. 2 is a schematic perspective view of a conventional arrangement of bit lines.

FIG. 2 is a schematic perspective view of a conventional arrangement of signal transfer conductive layers, e.g., bit lines. Particularly, FIG. 2 is a schematic perspective view of the part A of FIG. 1A.

Referring to FIG. 2, a lower layer 120 is formed ranging from a cell region (cell array region) to a core/peripheral region (peripheral region), and a plurality of signal transfer conductive layers are consecutively formed ranging from the cell region (cell array region) to the core/peripheral region. In the current embodiment, the plurality of signal transfer conductive layers may be, for example, bit lines. In the cell region, a plurality of cell array signal transfer conductive layers 124 (also referred to as cell signal transfer conductive layers) are buried in the lower layer 120 in a predetermined direction. In the core/peripheral region, a plurality of core/peripheral signal transfer conductive layers 140 (also referred to as peripheral signal transfer conductive layers) are formed over the lower layer 120 in the predetermined direction.

The plurality of cell array signal transfer conductive layers 124 are formed from the cell region to extend by a predetermined length to the core/peripheral region. The plurality of cell array signal transfer conductive layers 124 are electrically connected to the core/peripheral signal transfer conductive layers 140 via a plurality of first contact plugs 126 formed in the core/peripheral region, respectively. The plurality of cell array signal transfer conductive layers 124 are connected to first source/drain regions of a plurality of cell transistors (not shown) arranged in the cell region. FIG. 2 is a conceptual perspective view, in which the first contact plugs 126 are illustrated as being formed in the core/peripheral region. However, the first contact plugs 126 may be formed in the cell region as long as they are located adjacent to a border line between the cell region and the core/peripheral region. In this case, the core/peripheral signal transfer conductive layers 140 may extend from the core/peripheral region to the cell region so as to be electrically connected to the plurality of cell array signal transfer conductive layers 124. Referring to FIG. 2, the plurality of core/peripheral region signal transfer conductive layers 140 are illustrated as extending in the same direction in which the plurality of cell array signal transfer conductive layers 124 extend, but may extend in a direction perpendicular to the direction in which the plurality of cell array signal transfer conductive layers 124 extend, or in any other direction, according to the design of peripheral circuits.

The plurality of cell array signal transfer conductive layers 124 may be formed of a material selected from the group consisting of metal, a metal nitride, a metal silicide, and combinations/subcombinations thereof. For example, the plurality of cell array signal transfer conductive layers 124 may be formed of metal selected from the group consisting of tungsten (W), aluminum (Al), copper (Cu), molybdenum (Mo), titanium (Ti), tantalum (Ta), and ruthenium (Ru), may be formed of a metal nitride selected from the group consisting of TiN, TiN/W, Ti/TiN, WN, W/WN, TaN, Ta/TaN, TiSiN, TaSiN, and WSiN, and/or may be formed of a metal silicide selected from the group consisting of $CoSi_2$, $TiSi_2$, and $WSi_2$.

FIG. 3 is a cross-sectional view partially illustrating a memory device according to embodiments of the inventive concept. In FIG. 3, a cell array signal transfer conductive layer 124 and a core/peripheral region signal transfer conductive layer 140, such as those illustrated in FIG. 2, are illustrated. Referring to FIG. 3, a lower layer 120 is formed on a microelectronic substrate, such as a semiconductor substrate 110, e.g., a silicon substrate. The lower layer 120 may be, for example, a silicon oxide layer-based interlayer insulating layer 120. The interlayer insulating layer 120 formed in the semiconductor substrate 110 has an upper surface 120H with the same level vertically, ranging from a cell region to a core/peripheral region, i.e., the lower layer 120 has a flat outer surface 120H. In the interlayer insulating layer 120, for example, the cell array bit line 124 corresponding to the cell array signal transfer conductive layers 124 of FIG. 2 is buried, and a plurality of buried contact (BC) layers 122 are formed on locations where storage electrodes 152 of capacitors 150 are to be formed by using, for example, polysilicon. The BC layers 122 are electrically connected to second source/drain regions of cell transistors (not shown) included in the cell region. The cell array bit line 124 extends adjacent to the border line between the cell region and the core/peripheral region.

In the cell region, the capacitors 150 are formed on the interlayer insulating layer 120 to correspond to the BC layers 122, respectively. Each of the capacitors 150 may include the storage electrode 152, a capacitor dielectric layer 154, and a plate electrode 156. The storage electrode 152 of a respective one of the capacitors 150 contacts one of the BC layers 122 while passing through a second (stepped) stopper layer 132, a first insulating molding layer 134, and a first (flat) stopper layer 136 on the interlayer insulating layer 120.

Each of the capacitors 150 has a cylindrical shape on the first (flat) stopper layer 136 and a concave shape below the first (flat) stopper layer 136. Thus, the capacitor dielectric layer 154 is formed not only along an inner surface, upper surface, and outer surface of the cylindrical shape of the storage electrode 152 but also along an inner surface and bottom surface of the concave shape of the storage electrode 152. Thus, a larger capacitance per unit area may be provided. Moreover, the first insulating molding layer 134 and the flat stopper layer 136 may support the storage nodes 152 during fabrication so as to allow higher storage nodes to be formed reliably, with reduced risk of leaning.

In the core/peripheral region, the core/peripheral bit line 140 corresponding to the core/peripheral signal transfer conductive layers 140 of FIG. 2 is formed over the flat outer (upper) surface 120H of the interlayer insulating layer 120. The core/peripheral bit line 140 is electrically connected to the cell array bit line 124 extending from the cell region, via a contact plug 126. The contact plug 126 is also referred to as a direct contact (DC) plug. An insulating layer 130 is formed between the core/peripheral bit line 140 and the interlayer insulating layer 120 while covering the contact plug 126. Stated differently, the insulating layer 130 extends along a sidewall of the contact plug 126 to an underside of the peripheral bit line 140.

In order to improve contact resistance characteristics between the contact plug 126 and the cell array bit line 124 below the contact plug 126, the contact plug 126 may be formed by applying a barrier metal layer, e.g., a titanium/titanium nitride material, inside a contact hole and filling the inside of the contact hole with the same conductive material, e.g., tungsten, which was used to form the core/peripheral bit line 140. The insulating layer 130 may be formed of an oxide layer and/or nitride layer-based insulating layer.

The second (stepped) stopper layer 132 is formed on the interlayer insulating layer 120 while covering the core/peripheral bit line 140, and the first insulating molding layer 134 and the first (flat) stopper layer 136 are formed on the second stopper layer 132.

The second stopper layer 132 is formed on the entire interlayer insulating layer 120 while covering the core/peripheral bit line 140, and the first insulating molding layer 134 has a planarized upper surface (i.e., a flat outer surface), ranging from the cell region to the core/peripheral region. Referring to FIG. 3, the thickness of the first insulating molding layer 134 formed on the core/peripheral bit line 140 is equal to a distance H1 between an upper surface of the second stopper layer 132 and a lower surface of the first stopper layer 136. In FIG. 3, 'H2' denotes the thickness of the second stopper layer 132. Thus, the distance between the upper surface of the core/peripheral bit line 140 and the lower surface of the first stopper layer 136 is equal to the sum of the distances H1 and H2.

Methods of fabricating a semiconductor memory device of FIG. 3 according to various embodiments of the inventive concept will now be described with reference to FIGS. 4A to 4G.

Figure 4A:
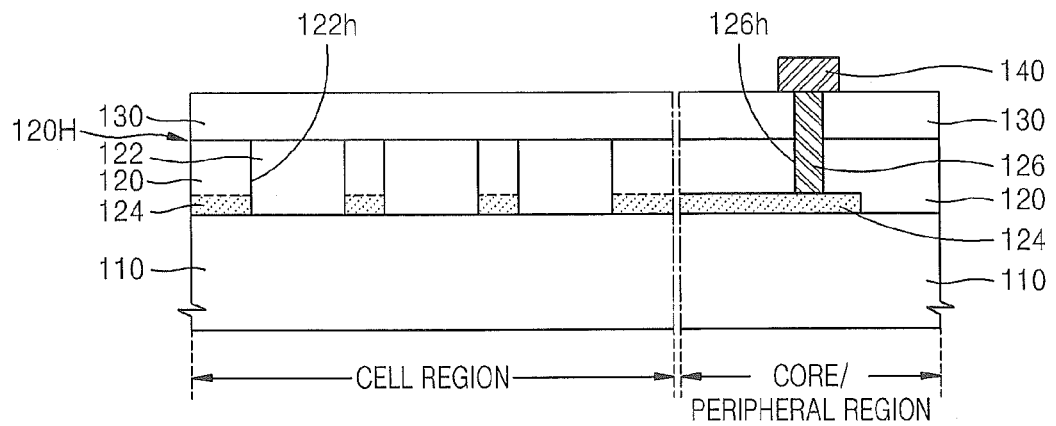
FIGS. 4A to 4G are cross-sectional views illustrating methods of fabricating a memory device of FIG. 3, according to various embodiments of the inventive concept.

Referring to FIG. 4A, a silicon oxide layer or silicon nitride layer-based interlayer insulating layer 120 is formed on an entire microelectronic substrate, such as a semiconductor substrate 110, e.g., a silicon substrate, having a cell transistor (not shown) in a cell region and then, an upper surface of the interlayer insulating layer 120 is planarized by etching back and/or chemical mechanical polishing (CMP). Next, a mask pattern (not shown) for exposing locations where buried contact (BC) layers 122 are to be formed is formed. Then, buried contact (BC) holes 122h are formed by etching parts of the interlayer insulating layer 120 corresponding to the locations by using the mask pattern as an etch mask, until an upper surface of the semiconductor substrate 110 is exposed. Next, a material for forming the BC layers 122, e.g., doped polysilicon, is applied on the entire interlayer insulating layer 120 so that the BC holes 122h may be completely filled with the material, and then, CMP is performed on the resultant structure, thereby forming the BC layers 122 to be separated from one another.

Before the interlayer insulating layer 120 is formed, the cell array bit lines 124 are formed by applying a metallic conductive material, for example, which is selected from the group consisting of cobalt, nickel, and/or titanium, onto the semiconductor substrate 110, and patterning the resultant structure. Thus, the cell array bit lines 124 are buried in the interlayer insulating layer 120 to be insulated from the BC layers 122. The cell array bit lines 124 extend from the cell region to the core/peripheral region.

Next, an oxide layer and/or nitride layer-based insulating layer 130 is formed over the interlayer insulating layer 120, the upper surface of which has been planarized, to a thickness of several tens to several thousands of Å, and in some embodiments, to a thickness of several hundreds of Å (a thickness of about 700 Å in the current embodiment). Then, the insulating layer 130 is planarized by performing CMP thereon so that the insulating layer 130 may remain to a thickness of about 500 Å on the interlayer insulating layer 120. Next, a DC contact hole 126h for forming a contact plug 126 is formed in the core/peripheral region by using a general photolithography process and an etching process.

Next, the core/peripheral bit line 140 and the contact plug 126 are formed by applying a titanium/titanium nitride material as a barrier metal material onto the entire insulating layer 130 including the DC contact hole 126h, applying a material, e.g., tungsten, cobalt, nickel, or titanium, for forming the core/peripheral bit line 140 to a predetermined thickness onto the insulating layer 130 so that the DC contact hole 126h may also be sufficiently filled with the material, and partially removing the material for forming the core/peripheral bit line 140 and the barrier metal material from the insulating layer 130 by using the photolithography process. The contact plug 126 and the core/peripheral bit line 140 may be formed separately if needed.

Figure 4B:
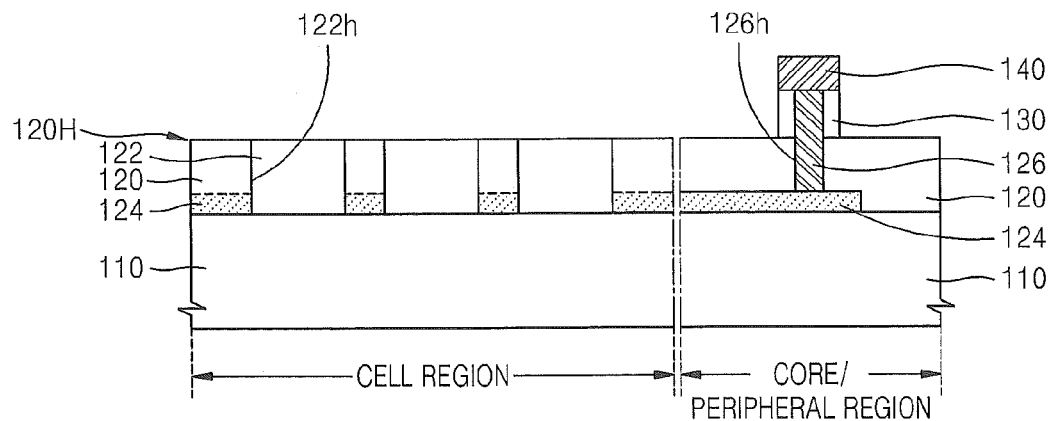

Next, referring to FIG. 4B, the exposed insulating layer 130 is etched and removed by using the core/peripheral bit line 140 as an etch mask. Eventually, only a part of the insulating layer 130, which is masked by the core/peripheral bit line 140, i.e., which covers sides or sidewalls of the contact plug 126, remains. Thus, the insulating layer 130 is completely removed from the interlayer insulating layer 120 in the cell region. Accordingly, the BC layers 122 are exposed in the cell region, and a cell open photo process is thus not needed to be performed so as to form storage electrodes 152 in the cell region, thereby simplifying the manufacturing process.

In the current stage, the insulating layer 130 is removed only from the cell region, and the shape of the insulating layer 130 remaining in the core/peripheral region is thus not limited. For example, only a part of the insulating layer 130, which corresponds to a pattern of the core/peripheral bit line 140, may remain, since the insulating layer 130 may be etched using the core/peripheral bit line 140 as an etch mask without having to perform the photolithography process. The core/peripheral bit line 140 is formed in such a manner that the core/peripheral bit line 140 may be securely, electrically connected to the contact plug 126 below the core/peripheral bit line 140 even when an alignment error occurs during the forming of the pattern of the core/peripheral bit line 140.

The insulating layer 130 is completely removed from the cell region but remains below the core/peripheral bit line 140. Thus, a lower surface of the core/peripheral bit line 140 is higher in the vertical direction than those of the storage electrodes 152 to be formed in the cell region.

Figure 4C:
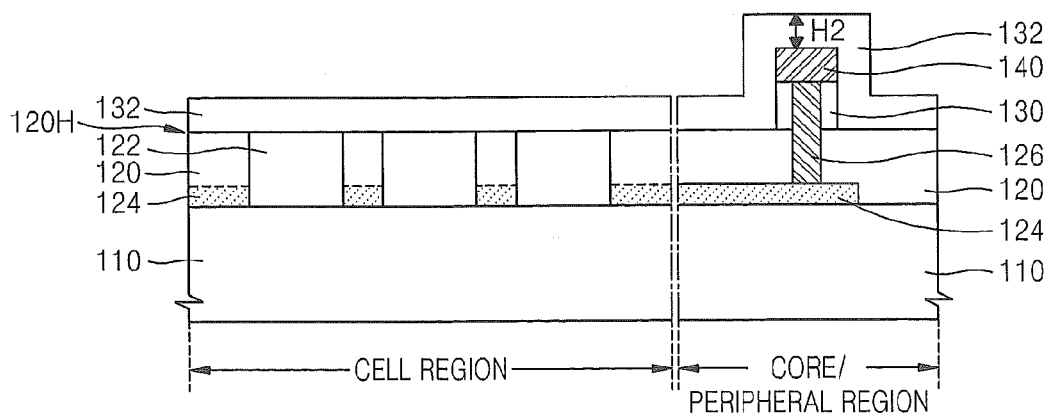

Next, referring to FIG. 4C, in the core/peripheral region, the second (stepped) stopper layer 132 is formed of, for example, a silicon nitride to a thickness H2 of several hundreds of Å, and in some embodiments, to a thickness H2 of about 100 to 250 Å on the entire interlayer insulating layer 120 having the core/peripheral bit line 140 thereon, by using CVD.

Figure 4D:
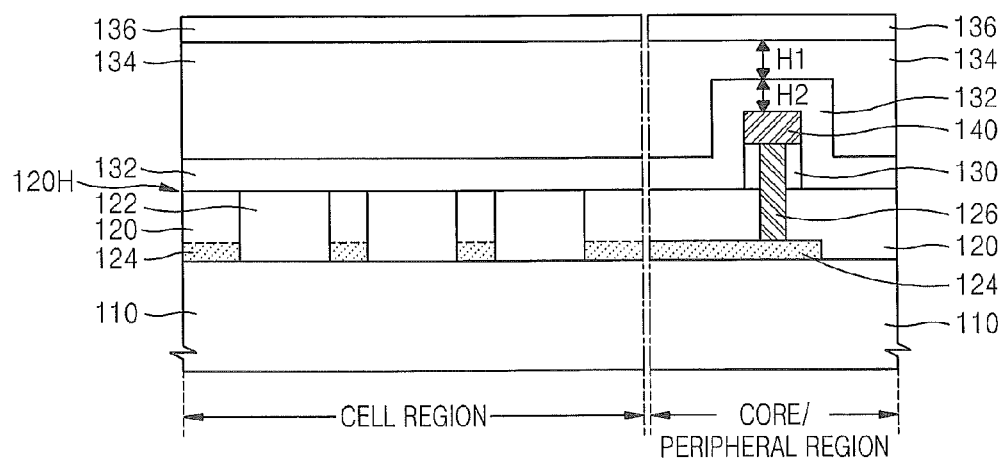

Next, referring to FIG. 4D, the first insulating molding layer 134 is formed thickly on the entire semiconductor substrate 110 having the second stopper layer 132 thereon, and is then planarized by using CMP. Thus, the first insulating molding layer 134 has a flat outer surface. The first insulating molding layer 134 is formed of a material, such as a TEOS oxide layer or a high-density plasma (HDP) oxide layer, which has a high etch selectivity with respect to the second stopper layer 132. The first insulating molding layer 134 may be formed to, for example, a thickness of several thousands of Å, and particularly, a thickness of about 2,000 Å. The thickness of the first insulating molding layer 134 remaining on the core/peripheral bit line 140 is equal to a distance H1 between an upper surface of the second stopper layer 132 and a lower surface of a first stopper layer 136. As previously mentioned, 'H2' denotes the thickness of the second stopper layer 132. Thus, a distance between an upper surface of the core/peripheral bit line 140 and a lower surface of the first stopper layer 136 is equal to the sum of the distances H1 and H2.

After planarizing the surface of the first insulating molding layer 134, the first (flat) stopper layer 136 is formed on the entire first insulating molding layer 134. For example, the first stopper layer 136 is formed of a silicon nitride to a thickness of several hundreds of Å, and in some embodiments, to a thickness of about 100 to 250 Å by using CVD.

Figure 4E:
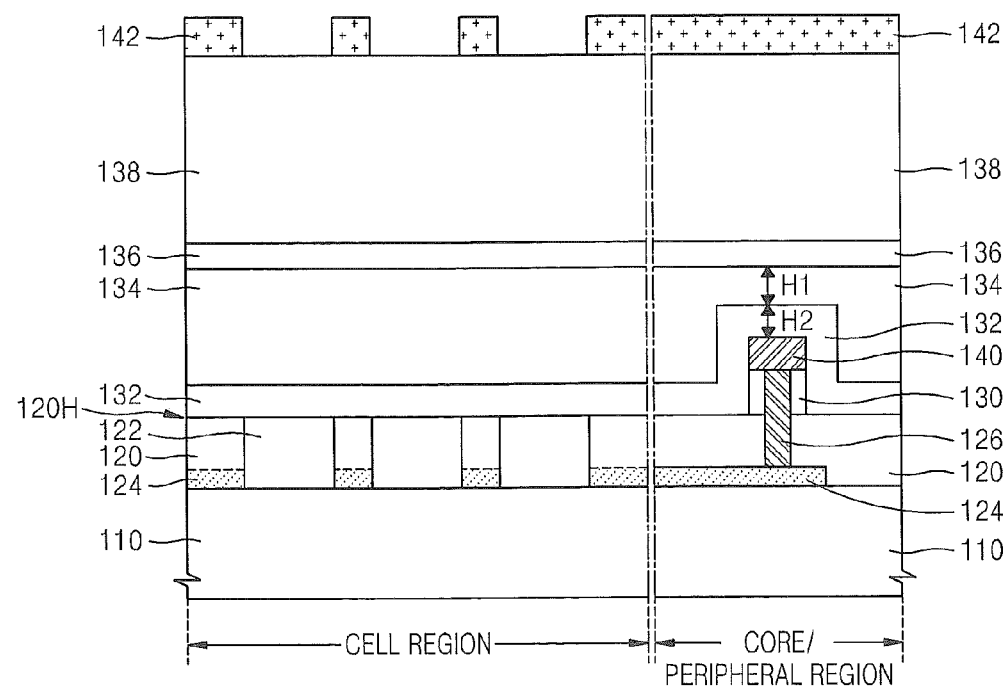

Next, referring to FIG. 4E, a second insulating molding layer 138 is thickly formed on the entire first (flat) stopper layer 136. The first insulating molding layer 138 is formed of a material, such as a TEOS oxide layer or a HDP oxide layer, which has a high etch selectivity with respect to the first (flat) stopper layer 136. The first insulating molding layer 138 is formed to, for example, a thickness of several thousands to seven ten thousands of Å. Although FIG. 4E illustrates a case where the second insulating molding layer 138 is a single layer, the second insulating molding layer 138 may include a plurality of insulating molding layers if desired.

Then, a mask pattern 142 for defining locations where the storage electrodes 152 are to be formed, is formed on the second insulating molding layer 138 by using a general photolithography process. Since the surface of the first insulating molding layer 134 has already been planarized, a planarizing process to be performed on the second insulating molding layer 138 before the mask pattern 142 is formed, may be omitted.

Figure 4F:
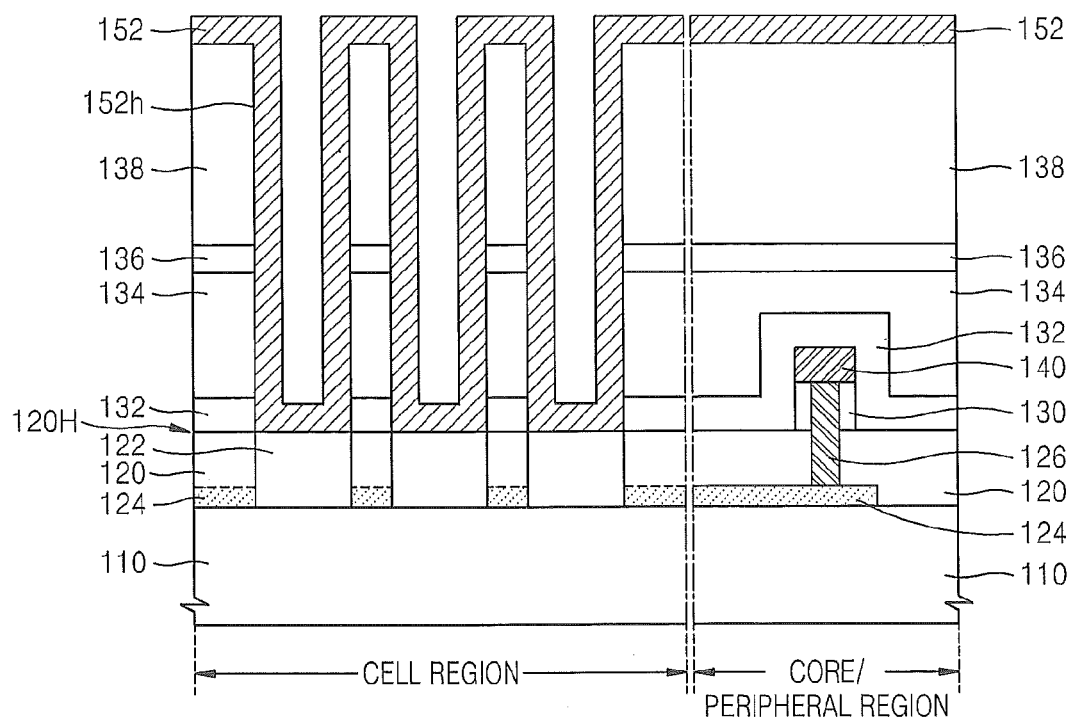

Next, referring to FIG. 4F, storage electrode contact holes 152h are formed using the mask pattern 142 as an etch mask by removing the second insulating molding layer 138, the first stopper layer 136, the first insulating molding layer 134, and the second stopper layer 132 exposed on the locations where the storage electrodes 152 are to be formed. In this case, the storage electrode contact holes 152h may be formed by performing etching while changing continuously or discontinuously etching conditions, e.g., wet or dry etching. Eventually, upper surfaces of the BC layers 122 formed in the interlayer insulating layer 120 are exposed via the storage electrode contact holes 152h. Next, the remaining mask pattern 142 is removed using a general strip process or ashing process, the storage electrode contact holes 152h are cleansed, and then, a material for forming the storage electrodes 152 is applied onto the entire semiconductor substrate 110 having the storage electrode contact holes 152h to an appropriate thickness in such a manner the storage electrode contact holes 152h are not filled with the material. For example, the material for forming the storage electrodes 152 may be selected from the group consisting of Ti, TiN, TaN, Pt, tungsten, polysilicon, and/or silicon-germanium. Accordingly, the material for forming the storage electrodes 152 are formed to the appropriate thickness on a bottom surface and inner side surface of each of the storage electrode contact holes 152h and an upper surface of the second insulating molding layer 138.

Figure 4G:
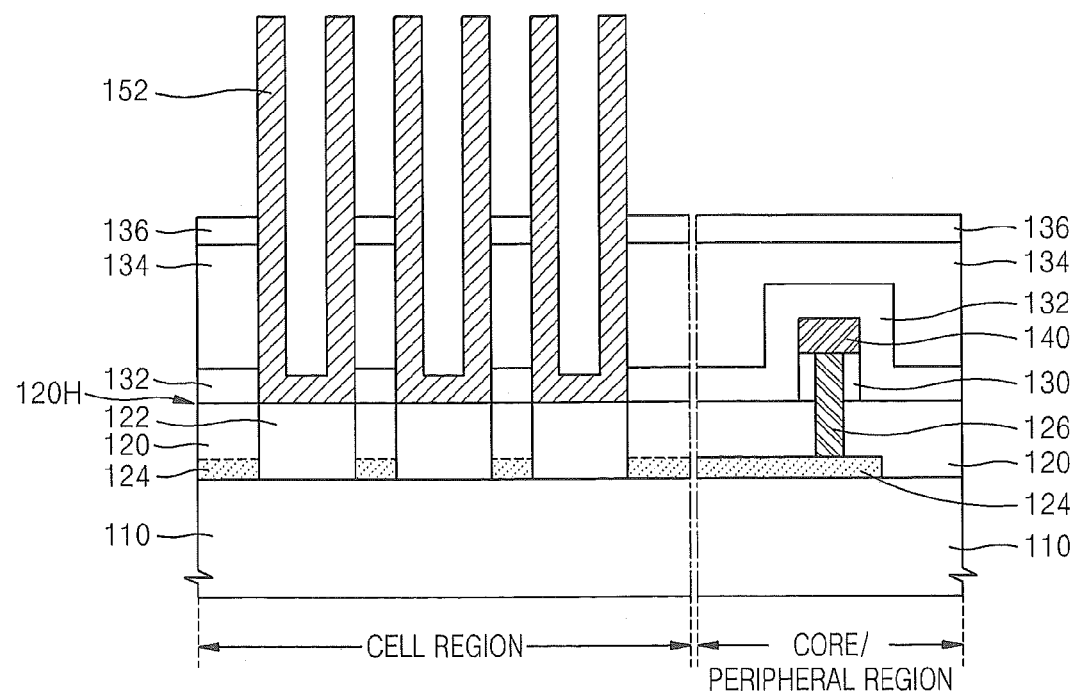

Next, referring to FIG. 4G, the storage electrodes 152, the nodes of which are separated from one another, are formed by performing CMP on the material for forming the storage electrodes 152. Next, the exposed second insulating molding layer 138 is removed, and a capacitor dielectric layer 154 and a plate electrode 156 are formed on the exposed storage electrode 152, thereby obtaining the capacitor 150 illustrated in FIG. 3.

In the current embodiments, as described above, the storage electrode 152 of the capacitor 150 has a cylindrical shape, in which an outer side surface, upper surface, and inner side surface are exposed on the first stopper layer 136, and has a concave shape, in which only the inner side surface and bottom surface are exposed below the first stopper layer 136. However, the storage electrodes 152 may be formed to have a pillar shape, in which the storage electrode contact holes 152h are completely filled with the material for forming the storage electrode 152, if needed.

Figure 5A:
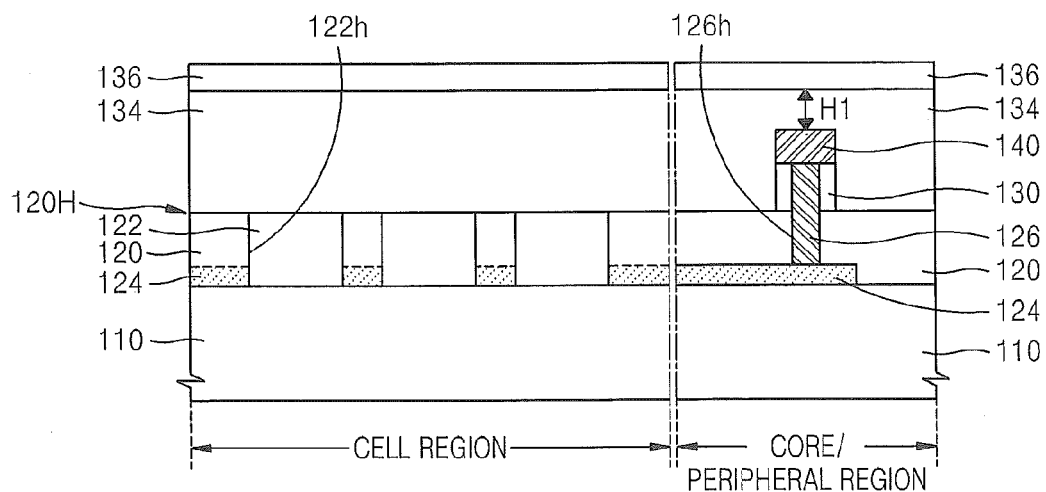
FIGS. 5A and 5B are cross-sectional views illustrating methods of fabricating a memory device, according to other embodiments of the inventive concept.
Figure 5B:
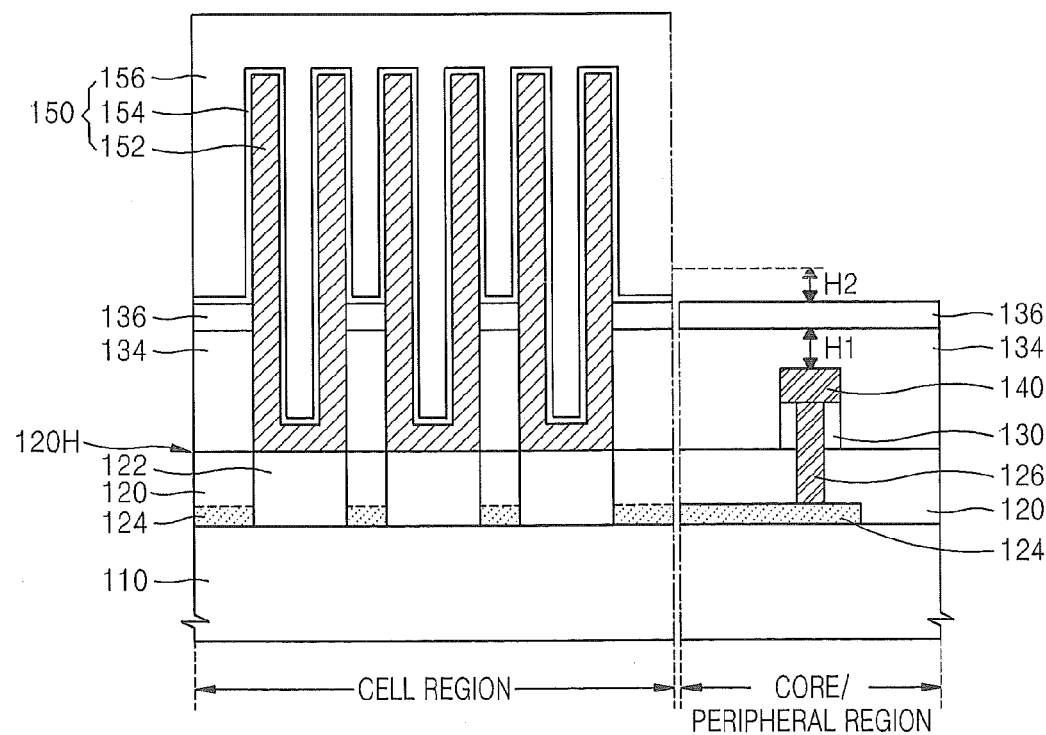

FIGS. 5A and 5B are cross-sectional views illustrating methods of fabricating a memory device, according to other embodiments of the inventive concept. The methods of FIGS. 5A and 5B is different from the methods described above with reference to FIGS. 4A to 4G in that the second (stepped) stopper layer 132 is not formed. The reference numerals that are the same as those of FIGS. 4A to 4G denote the same elements, and thus, a description of their operations or characteristics will not be described here again. The method of FIGS. 5A and 5B will now be described focusing on some of the differences between this method and the method of FIGS. 4A to 4G.

Referring to FIG. 5A, a pattern of a core/peripheral bit line 140 is formed in a core/peripheral region as described above with reference to FIG. 4B, a first insulating molding layer 134 is formed thickly on an entire interlayer insulating layer 120 having the core/peripheral bit line 140 thereon without having to form the second stopper layer 132 of FIG. 4C, and then CMP is performed on the resultant structure. Next, a first stopper layer 136 is formed on the entire planarized first insulating molding layer 134.

Since the second stopper layer 132 of FIG. 4C is not formed in the current embodiment, a distance between an upper surface of the core/peripheral bit line 140 and a lower surface of the first stopper layer 136 may be equal to a thickness H1 of the first insulating molding layer 134 on the core/peripheral bit line 140 as illustrated in FIG. 4D. Thus, the distance between the upper surface of the core/peripheral bit line 140 and the lower surface of the first stopper layer 136 may be less by the thickness H2 of the second stopper layer 132 than in the resultant structure illustrated in FIG. 4D. Alternatively, the distance between the upper surface of the core/peripheral bit line 140 and the lower surface of the first stopper layer 136 may be increased by increasing the thickness of the first insulating molding layer 134 by the thickness H2 of the second stopper layer 132 of FIG. 4C.

Next, referring to FIG. 5B, a second insulating molding layer (not shown) is thickly formed on the entire first stopper layer 136. Next, a mask pattern (not shown) for defining locations where storage electrodes 152 are to be formed, is formed on the second insulating molding layer by using a general photolithography process. Storage electrode contact holes are formed by removing the second insulating molding layer, the first stopper layer 136, and the first insulating molding layer 134 exposed on the locations where the storage electrodes 152 are to be formed, by using the mask pattern as an etch mask storage electrode 152. Next, the remaining mask pattern is removed using a general strip process and ashing process, the storage electrode contact holes are cleansed, and a material for forming the storage electrodes 152 are applied to an appropriate thickness onto an entire semiconductor substrate 110 including the storage electrode contact holes in such a manner that the storage electrode contact holes are not filled with the material.

Next, CMP is performed on the material for forming the storage electrodes 152 so as to form the storage electrodes 152, the nodes of which are separated from one another, the remaining second insulating molding layer is removed, and a capacitor dielectric layer 154 and a plate electrode 156 are formed on the exposed storage electrodes 152, thereby obtaining the capacitors 150.

Compared to the resultant structure of FIG. 3, the second stopper layer 132 is not formed in the resultant structure of FIG. 5B. Thus, if the heights of the storage electrodes 152 are the same as in the resultant structure of FIG. 3, then the exposed parts of the storage electrodes 152 may be higher by the thickness H2 of the second stopper layer 132 than in the resultant structure of FIG. 3. Accordingly, effective cross-sectional areas of the capacitors 150 may be increased, thereby securing high capacitance. If the capacitors 150 are formed to have the same effective cross-sectional areas as illustrated in FIG. 3, the thickness of the first insulating molding layer 134 should be increased, and thereby a process margin may be increased.

Figure 6:
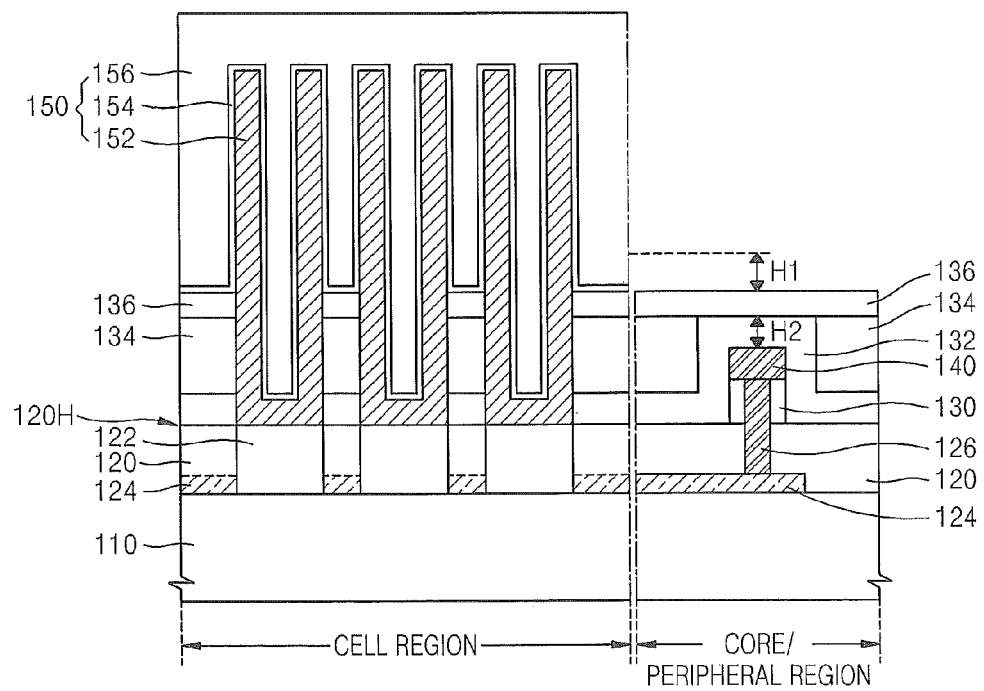
FIG. 6 is a cross-sectional view of a semiconductor memory device according to other embodiments of the inventive concept.

FIG. 6 is a cross-sectional view of a memory device according to other embodiments of the inventive concept. Referring to FIG. 6, a surface of a first insulating molding layer 134 is planarized until a second stopper layer 132 formed on a core/peripheral bit line 140 is exposed. The reference numerals that are the same as those of FIG. 3 denote the same elements, and thus, a description of their operations or characteristics will not be described here again. In FIG. 6, a portion of the stepped stopper layer 132 that extends onto the signal transfer layer 140 in the peripheral region directly contacts the flat stopper layer 136.

Referring to FIG. 6, a surface of a first insulating molding layer 134 illustrated in FIG. 4D is planarized until a second stopper layer 132 formed on a core/peripheral bit line 140 is exposed. Thus, if the heights of storage electrodes 152 are the same as in the resultant structure of FIG. 3, then exposed parts of the storage electrodes 152 may be higher by a thickness H1 of the first insulating molding layer 134 remaining between an upper surface of the second stopper layer 132 and a lower surface of a first stopper layer 136 than in the resultant structure of FIG. 3. Thus, effective cross-sectional areas of capacitors 150 may be increased, thereby securing high capacitance.

Figure 7:
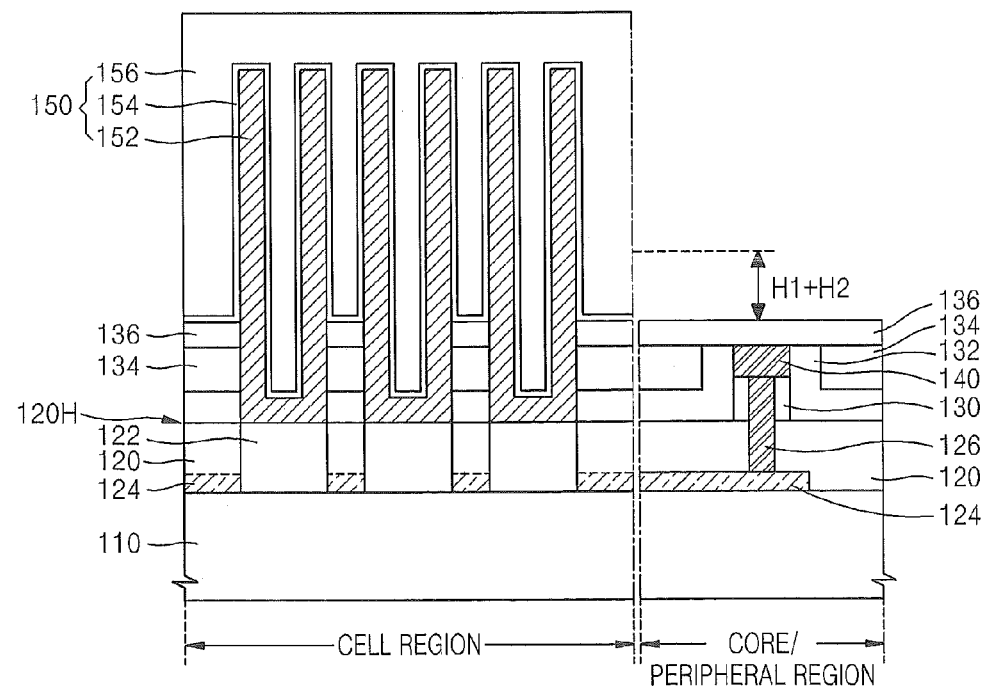
FIG. 7 is a cross-sectional view of a memory device according to other embodiments of the inventive concept.

FIG. 7 is a cross-sectional view of a memory device according to other embodiments of the inventive concept. Referring to FIG. 7, a surface of a first insulating molding layer 134 is planarized until an upper surface of a core/peripheral bit line 140 is exposed. The reference numerals that are the same as those of FIG. 3 denote the same elements, and thus, a description of their operations or characteristics will not be described here again. In FIG. 7, the stepped stopper layer 132 extends onto sidewalls of the signal transfer conductive layer 140 in the peripheral region, but not onto an outer (top) surface thereof. The flat stopper layer 136 extends directly on the outer (top) surface of the signal transfer conductive layer 140.

Referring to FIG. 7, a surface of a first insulating molding layer 134 illustrated in FIG. 4D is planarized until an upper surface of a core/peripheral bit line 140 is exposed. Thus, if the heights of storage electrodes 152 are the same as in the resultant structure of FIG. 3, then exposed parts of the storage electrodes 152 may be higher by the sum of a thickness H1 of the first insulating molding layer 134 remaining between an upper surface of a second stopper layer 132 and a lower surface of a first stopper layer 136 and a thickness H2 of the second stopper layer 132, i.e., H1+H2, than in the resultant structure of FIG. 3. Thus, effective cross-sectional areas of capacitors 150 may be increased, thereby securing high capacitance.

Figure 8:
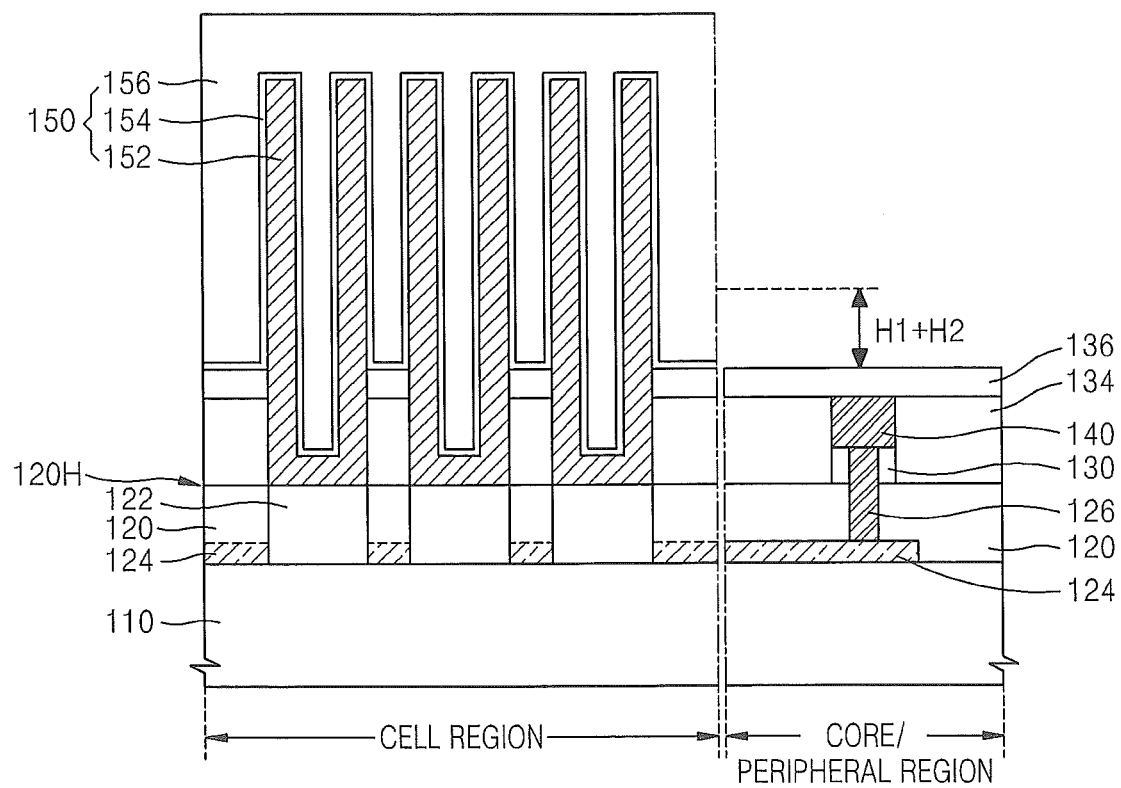
FIG. 8 is a cross-sectional view of a memory device according to other embodiments of the inventive concept.

FIG. 8 is a cross-sectional view of a memory device according to other embodiments of the inventive concept. In detail, FIG. 8 illustrates a case where the second (stepped) stopper layer 132 of FIG. 3 is not present, and a surface of a first insulating molding layer 134 is planarized until an upper surface of a core/peripheral bit line 140 is exposed. The reference numerals that are the same as those of FIG. 5B denote the same elements, and thus, a description of their operations or characteristics will not be described here again. In FIG. 8. the flat stopper layer 136 extends directly on an outer (top) surface of the peripheral signal transfer layer 140.

Referring to FIG. 8, a surface of a first insulating molding layer 134 illustrated in FIG. 5A is planarized until an upper surface of a core/peripheral bit line 140 is exposed. Thus, if the heights of storage electrodes 152 are the same as in the resultant structure of FIG. 3, then exposed parts of the storage electrodes 152 may be higher by the sum of a thickness H1 of the first insulating molding layer 134 remaining between an upper surface of a second stopper layer 132 and a lower surface of a first stopper layer 136 and a thickness H2 of the second stopper layer 132, i.e., H1+H2, than in the resultant structure of FIG. 3. Thus, effective cross-sectional areas of capacitors 150 may be increased, thereby securing high capacitance.

Figure 9:
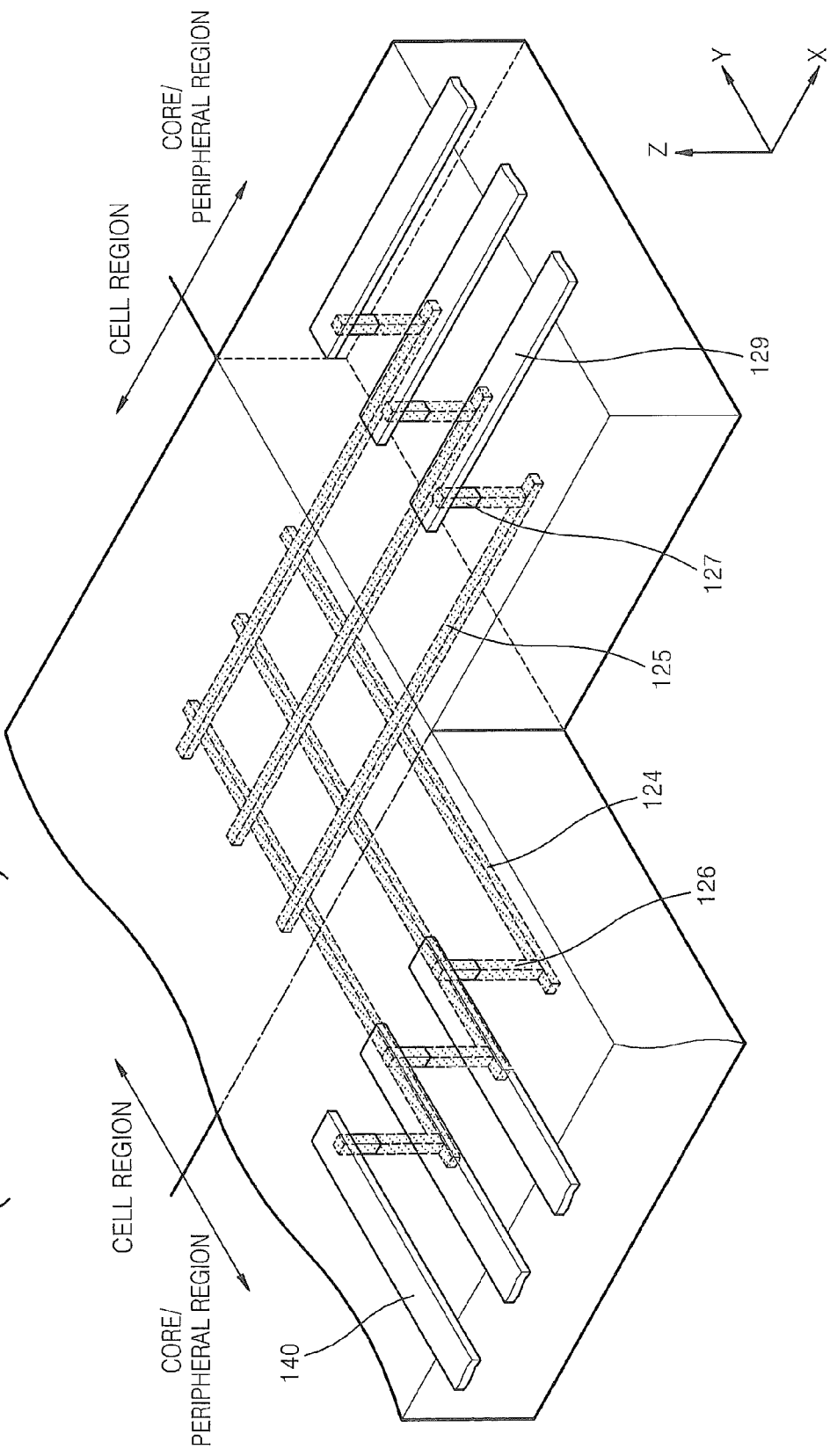
FIG. 9 is a schematic perspective view of a conventional arrangement of bit lines and word lines.

FIG. 9 is a schematic perspective view of an arrangement of bit lines and word lines. Particularly, FIG. 9 illustrates a case where the parts A and B of FIG. 1 are combined as illustrated in FIG. 2. Thus, the reference numerals that are the same as those of FIG. 2 denote the same elements, and thus, a description of their operations or characteristics will not be described here again.

Referring to FIG. 9, a lower layer 120 is formed from a cell region (cell array region) to a core/peripheral region, and a plurality of signal transfer conductive layers are formed from the cell region (cell array region) to the core/peripheral region in X and Y-axis directions. In FIG. 9, the signal transfer conductive layers formed in the X-axis direction denote word lines, and the other signal transfer conductive layers formed in the Y-axis direction denote bit lines. Cell array signal transfer conductive layers 124 and 125 are formed in the cell region and extend by a predetermined length to the core/peripheral region, and are electrically connected to core/peripheral signal transfer conductive layers 140 and 129 via contact plugs 126 and 127 formed in the core/peripheral region and/or in the cell array region. The cell array signal transfer conductive layers 125 that are word lines are connected to gates of a plurality of cell transistors (not shown) disposed in the cell region, and the cell array signal transfer conductive layers 124 that are bit lines are connected to sources/drains of the cell transistors.

In the cell region, the bit lines and the word lines are insulated from one another, and may be formed together in the lower layer 120 or the semiconductor substrate 110 of FIG. 3 below the lower layer 120 or may be formed separately in different layers.

Figure 10:
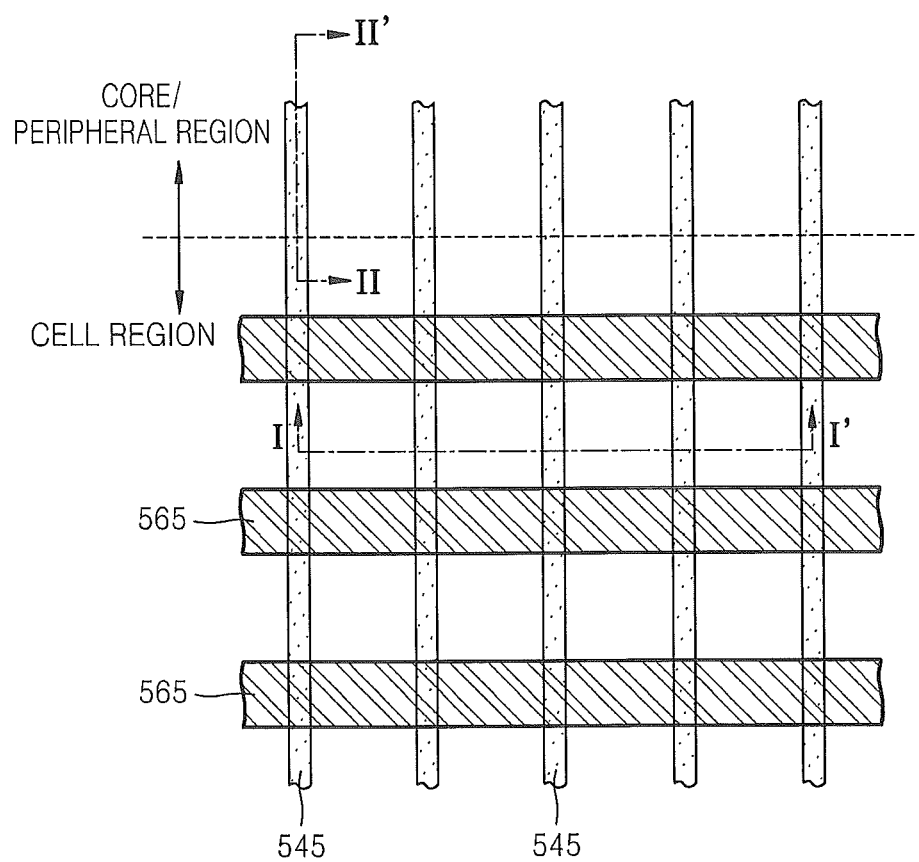
FIG. 10 is a plan view of a memory device according to other embodiments of the inventive concept.
Figure 11A:
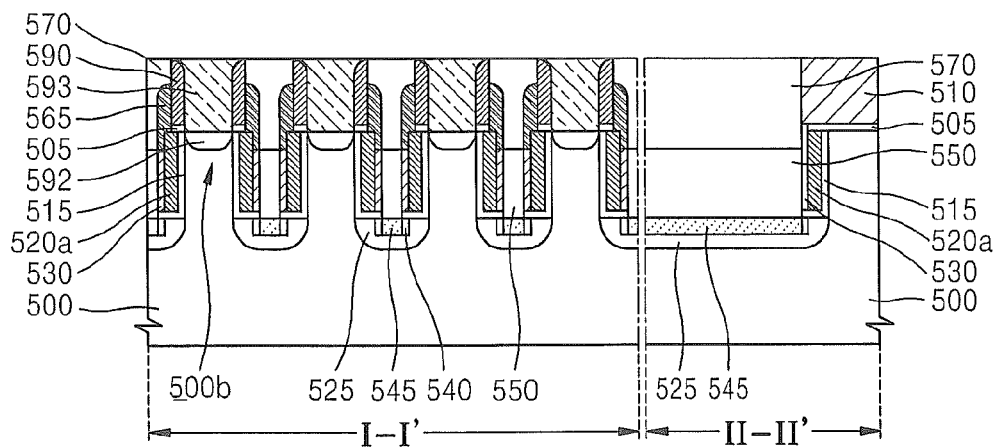
FIGS. 11A and 11B are cross-sectional views of a memory device and methods of fabricating the same, according to other embodiments of the inventive concept.
Figure 11B:
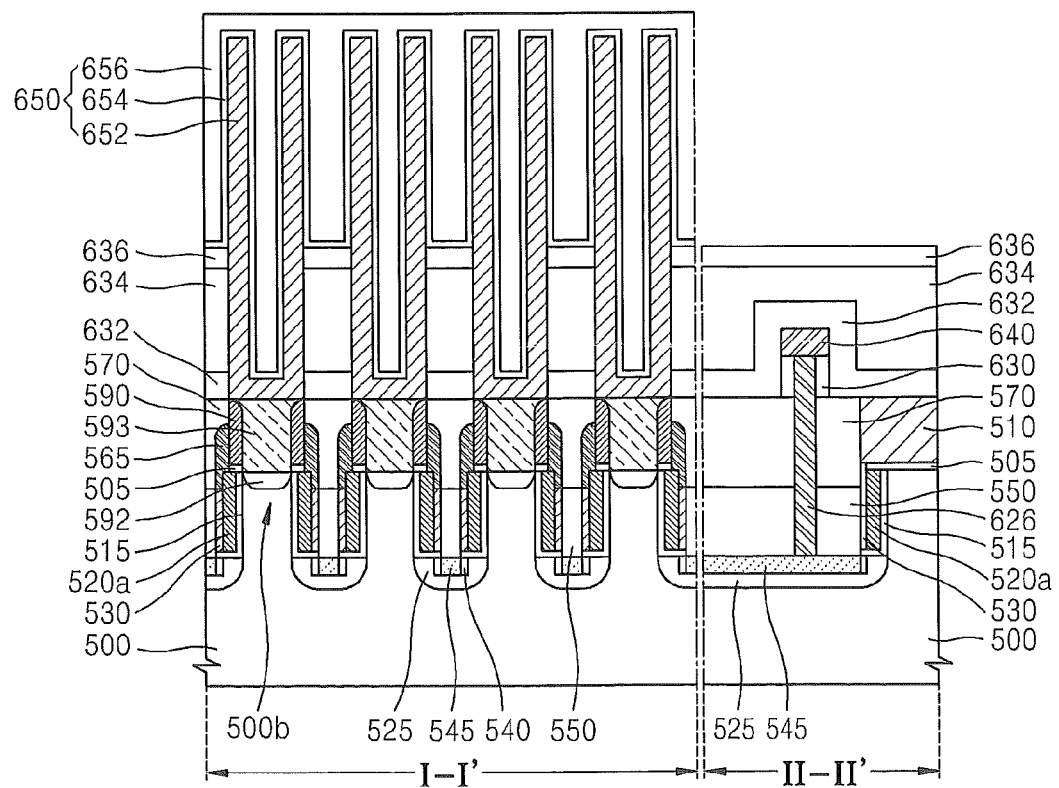

FIG. 10 is a plan view of a memory device according to other embodiments of the inventive concept. FIGS. 11A and 11B are cross-sectional views illustrating a memory device and methods of fabricating the same, according to other embodiments of the inventive concept. In the current embodiments, bit lines 545 are buried in a semiconductor substrate 500, and word lines 565 are buried in an interlayer insulating layer 570 disposed on the semiconductor substrate. Moreover, vertical channel transistors are formed. In FIGS. 11A and 11B, left parts of the drawings are cross-sectional views taken along a line I-I' of FIG. 10, and right parts of the drawings are cross-sectional views taken along a line II-II' of FIG. 10.

Particularly, FIG. 10 is a plan view illustrating an arrangement of the word lines 565 and the bit lines 545 that are formed subsequently in a cell array region. Also, the line I-I' indicates locations of the word lines 565 in a cell array region, and the line II-II' indicates locations of the bit lines 545 formed around a border line between the cell region and a core/peripheral region.

Referring to FIG. 11A, a pad oxide layer 505 and a hard mask layer 510 are sequentially formed on a semiconductor substrate 500, and then, a plurality of pillars 500b are formed in the semiconductor substrate 500 by etching the semiconductor substrate 500 to a predetermined depth by using the hard mask layer 510 as an etch mask. Dry or wet etching is performed on the plurality of pillars 500b so as to reduce the widths of the plurality of pillars 500b. Next, a gate dielectric layer 515 is formed on the exposed semiconductor substrate 500 and the pillars 500b, and a gate electrode material is applied onto the gate dielectric layer 515. Next, a gate electrode 520a is formed covering the pillar 500b by etching the gate electrode material 520 by using the gate dielectric layer 515 as an etch stopper.

Next, source/drain regions 525 are formed by implanting impurity ions into the semiconductor substrate 500 exposed between the pillars 500b. Next, an insulating layer 530 is formed on the entire semiconductor substrate 500 having the source/drain regions 525 therein, the insulating layer 530 is removed from the semiconductor substrate 500 by using the insulating layer 530 as a mask, and then, recesses are formed in the exposed semiconductor substrate 500 by using the insulating layer 530 as a mask. Depths of the recesses are lower than those of the source/drain regions 525. Bit lines 545 are to be formed in the recesses, and the bit lines 545 and the gate electrode 520a are insulated from one another by forming an insulating layer 540 only on sidewalls of the recesses. Referring to FIG. 11A, the recesses in which the bit lines 545 are to be formed extend to the right part of the drawing.

The bit lines 545 are formed by applying a metallic material, such as cobalt, titanium and/or nickel, on the insides of the recesses. Next, spaces that are defined on the bit lines 545 by the hard mask layer 510, are filled with a first interlayer insulating layer 550. Next, conductive spacers 565 are formed by etching the first interlayer insulating layer 550 to a predetermined depth by using the hard mask layer 510 as a mask. Alternatively, an additional dummy pattern (not shown) may be used on locations where the bit lines 545 are to be formed, and the first interlayer insulating layer 550 may not be etched in this case. Next, a second interlayer insulating layer 570 is formed completely covering the conductive spacers 565, and then, a surface of the resultant structure is planarized. The conductive spaces 565 are connected electrically to a part of word line.

Upper source/drain regions 592 are formed by partially etching and removing the hard mask layer 510, forming insulating spacers 590 on sidewalls of spaces obtained by partially removing the hard mask layer 510, and forming an impurity layer on the pillars 500b. Then, a BC layer 593 is formed of impurity-doped polysilicon.

Then, as illustrated in FIG. 11B, the method of FIGS. 4A to 4G is performed on the entire semiconductor substrate 500 having the second interlayer insulating layer 570. The same or similar elements as described above with reference to FIGS. 4A to 4G will not be described again here. A left part of FIG. 11B taken along a line I-I' may correspond to the cell region of FIG. 4, and a right part of FIG. 11B taken along a line II-II' may correspond to the core/peripheral region of FIG. 4.

An insulating layer 630 is formed on the entire planarized second interlayer insulating layer 570, and CMP is performed on the insulating layer 630. Next, a DC contact hole (not shown) for forming a contact plug 626 is formed in the core/peripheral region by using a general photolithography process and an etching process. Next, the contact plug 626 is formed by applying a titanium/titanium nitride as a barrier metal material onto the entire insulating layer 630 including the DC contact hole in which the contact plug 626 is to be formed, applying a metallic material, e.g., tungsten, onto the resultant structure so that the DC contact hole is filled with the metallic material, and then performing CMP on the resultant structure. Next, a metallic conducive material is formed on the entire insulating layer 60 having the contact plug 626 thereon and the resultant structure is patterned so as to form a core/peripheral bit line 640 that contacts the contact plug 626.

Next, the exposed insulating layer 630 is etched and removed by using the core/peripheral bit line 640 as an etch mask, and a second stopper layer 632 is formed on the entire second interlayer insulating layer 570 having the core/peripheral bit line 640 thereon in the core/peripheral region. Next, a first insulating molding layer 634 is formed thickly on the entire semiconductor substrate 500 having the second stopper layer 632 thereon and is then planarized by using CMP. After planarizing the surface of the first insulating molding layer 634, a first stopper layer 636 is formed on the entire first insulating molding layer 634. Thereafter, storage electrodes 652, the nodes of which are separated from one another, a capacitor dielectric layer 654, and a plate electrode 656 are formed as described above, thereby obtaining capacitors 650.

Figure 12A:
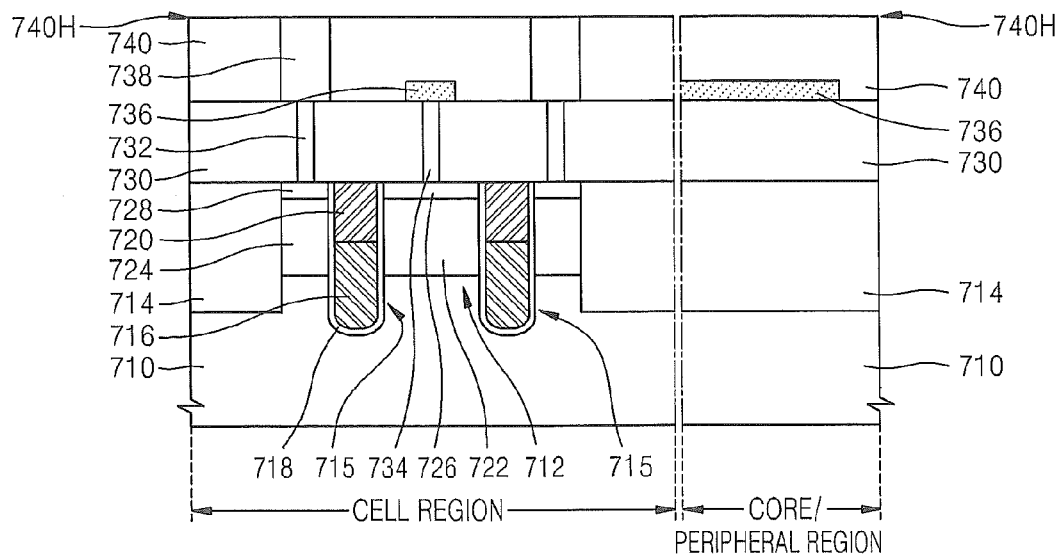
FIGS. 12A and 12B are cross-sectional views illustrating a memory device and methods of fabricating the same, according to other embodiments of the inventive concept.
Figure 12B:
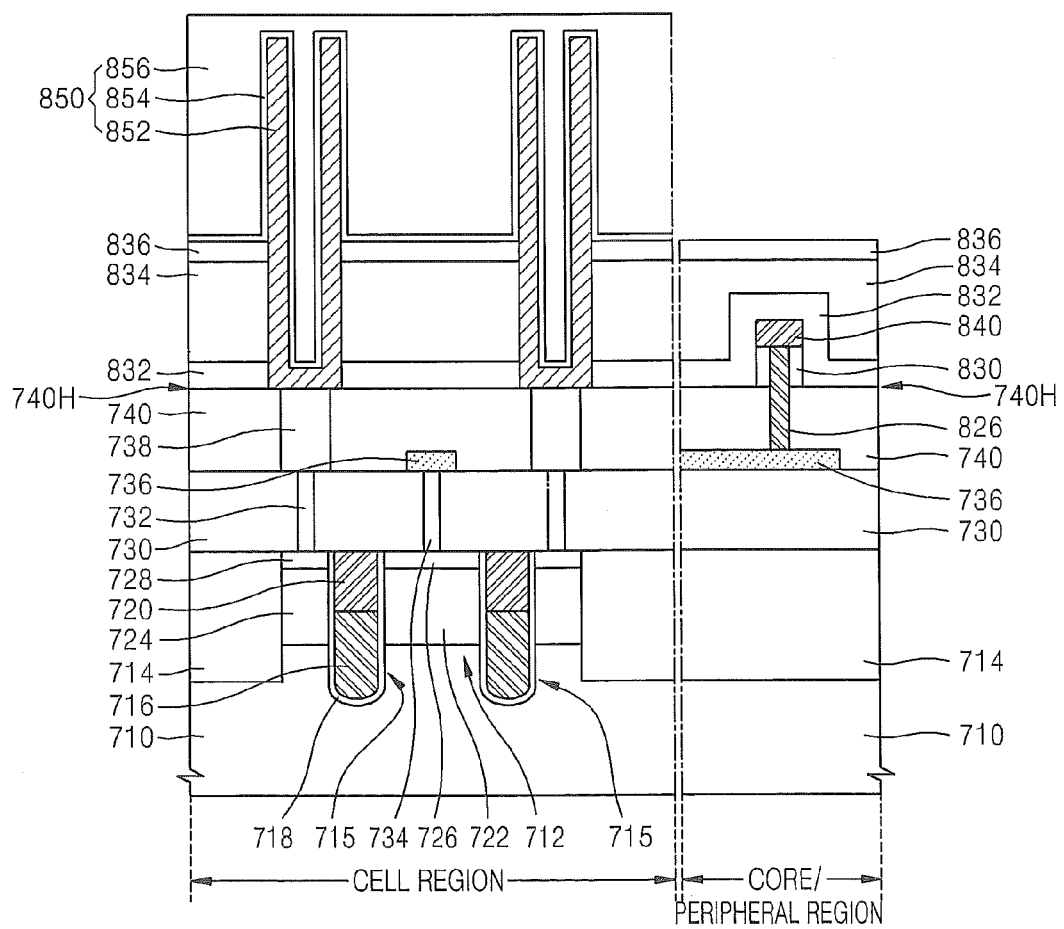

FIGS. 12A and 12B are cross-sectional views illustrating a memory device and methods of fabricating the same, according to other embodiments of the inventive concept. In the current embodiments, word lines are buried in a semiconductor substrate 710, and bit lines are buried in an interlayer insulating layer 740 disposed on the semiconductor substrate 710. Portions on the left side of FIGS. 12A and 12B denote a cell region, and portions on the right side thereof denote a core/peripheral region.

Referring to FIG. 12A, an active layer is defined in the semiconductor substrate 710 by an isolation region 714, and gate trenches 715 are formed in predetermined parts of the active region 712. A gate electrode 716 and a protective layer pattern 720 are formed in each of the gate trenches 715, and a gate insulating layer 718 is formed between the gate electrode 716 and the semiconductor substrate 710. Source/drain regions 722 and 724 are formed at sides of the gate electrode 716. The gate electrode 716 is connected electrically to a word line (not shown).

A first interlayer insulating layer 730 and a second interlayer insulating layer 740 are sequentially formed on the semiconductor substrate 710. A cell array bit line 736 is formed on the first interlayer insulating layer 730. The cell array bit line 736 is electrically connected to the source/drain region 722 via a contact plug 734 passing through the first interlayer insulating layer 730. The cell array bit line 736 extends by a predetermined length to the core/peripheral region.

The second interlayer insulating layer 740 is formed on the first interlayer insulating layer 730 having the cell array bit line 736 thereon. Also, BC layers 738 that are to be electrically connected to storage electrodes 852 of capacitors 850 of FIG. 12B, are formed in the second interlayer insulating layer 740 in the cell region, and the cell array bit line 736 extends by the predetermined length to the core/peripheral region.

Then, as illustrated in FIG. 12B, the method of FIGS. 4A to 4G is performed on the entire semiconductor substrate 710 having the second interlayer insulating layer 740 thereon. The same or similar elements as described above with reference to FIGS. 4A to 4G will not be described again here.

In the cell region, the capacitors 850 are formed on the BC layers 738 disposed on the second interlayer insulating layer 740, the surface of which is planarized. The capacitor 850 includes a storage electrode 852, a capacitor dielectric layer 854, and a plate electrode 856, and a second stopper layer 832, a first insulating molding layer 834, and a first stopper layer 836 are formed covering sides of the capacitors 850.

In the core/peripheral region, a contact plug 826 that is electrically connected to the cell array bit line 736 protrudes from an upper surface of the second interlayer insulating layer 740, and is electrically connected to a core/peripheral bit line 840 formed over an upper surface 740H. An insulating layer 830 is formed between the core/peripheral bit line 840 and the interlayer insulating layer 740 while covering sides of the protruding contact plug 826. A second stopper layer 832 is formed while covering the core/peripheral bit line 840, and a first insulating molding layer 834 and a first stopper layer 836 are formed on the second stopper layer 832.

Figure 13A:
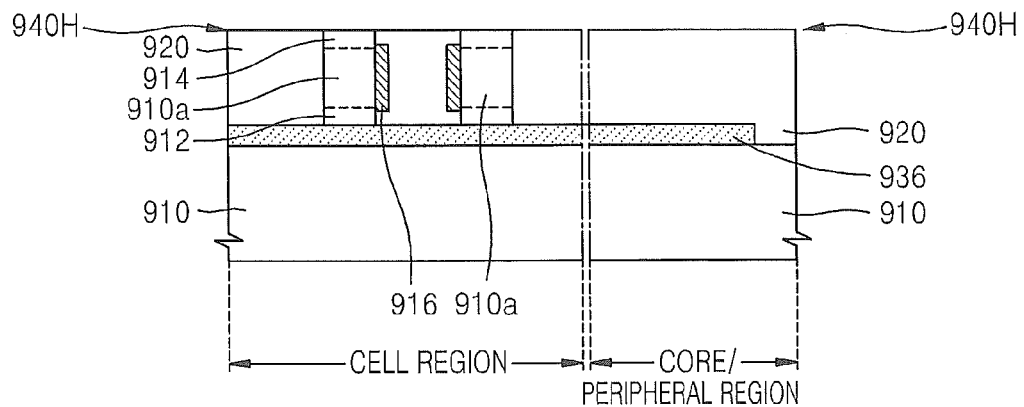
FIGS. 13A and 13B are cross-sectional views illustrating a memory device and methods of fabricating the same, according to other embodiments of the inventive concept.
Figure 13B:
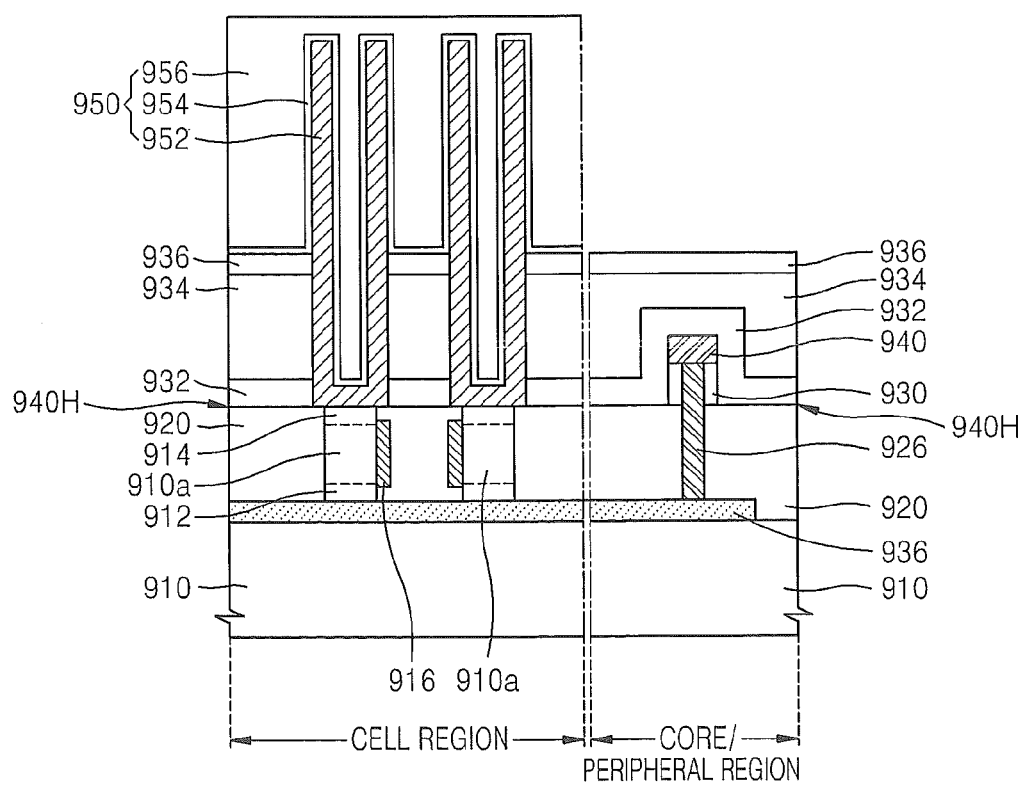

FIGS. 13A and 13B are cross-sectional views illustrating a memory device and methods of fabricating the same, according to other embodiments of the inventive concept. In the current embodiment, all bit lines and word lines are buried in a semiconductor substrate 910. Portions on the left side of FIGS. 13A and 13B denote a cell region, and portions on the right side thereof denote a core/peripheral region.

Referring to FIG. 13A, in the cell region, active regions 910a are formed in the form of a pole in the semiconductor substrate 910, and a buried insulating layer 920 is formed covering the active regions 910a. Source/drain regions 912 and 914 are formed by implanting impurities into upper and lower portions of the active regions 910a that are long in the vertical direction. A gate electrode 916 is formed by interposing a gate insulating layer (not shown) around the active regions 910a. The gate electrode 916 is electrically connected to a word line (not shown). A cell array bit line 936 is buried in the semiconductor substrate 910, and is electrically connected to the source/drain regions 912 formed in the lower portions of the active regions 910a.

In the core/peripheral region, the buried insulating layer 920 is formed on the semiconductor substrate 910, and the cell array bit line 936 extends while being buried in the buried insulating layer 920.

Referring to FIG. 13B, the method of 4A to 4G is performed on the entire semiconductor substrate 910 having the buried insulating layer 920 thereon. The same or similar elements as described above with reference to FIGS. 4A to 4G will not be described again here.

In the cell region, capacitors 950 are formed on the source/drain regions 914 formed in the upper portions of the active regions 910a in the semiconductor substrate 910. Each of the capacitors 950 includes a storage electrode 952, a capacitor dielectric layer 954, and a plate electrode 956, and a second stopper layer 932, a first insulating molding layer 934, and a first stopper layer 936 are formed covering each of the capacitors 950.

In the core/peripheral region, a contact plug 926 that is electrically connected to the cell array bit line 936 protrudes upward from the second interlayer insulating layer 920, and is also electrically connected to the core/peripheral bit line 940 formed over an upper surface 940H of the buried insulating layer 920. A insulating layer 930 is formed between the core/peripheral bit line 940 and the buried insulating layer 920 while covering the protruding contact plug 926. A second stopper layer 932 is formed covering the core/peripheral bit line 940, and a first insulating molding layer 934 and a first stopper layer 936 are formed on the second stopper layer 932.

Figure 14:
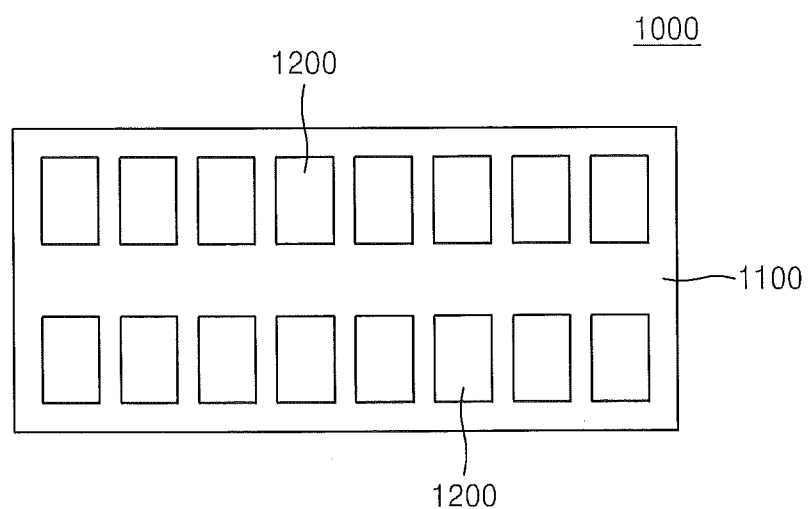
FIG. 14 is a plan view of a memory module that includes a memory device according to embodiments of the inventive concept.

FIG. 14 is a plan view of a memory module 1000 that includes a memory device according to various embodiments of the inventive concept.

The memory module 1000 may include a printed circuit board (PCB) 1100 or other mounting substrate and a plurality of microelectronic packages 1200.

The plurality of microelectronic packages 1200 may include memory devices according to various embodiments of the inventive concept. In particular, the plurality of packages 1200 may have the structural characteristics of at least one selected from among the memory devices according to the previous embodiments of the inventive concept.

In the current embodiment, the memory module 1000 may be either a single in-lined memory module (SIMM) in which the plurality of packages 1200 are mounted only on one surface of the PCB 1100, or a dual in-lined memory module (DIMM) in which the plurality of packages 1200 are mounted on both surfaces of the PCB 1100. Otherwise, the memory module 1000 according to the current embodiment may be a fully buffered DIMM (FBDIMM) having an advanced memory buffer (AMB) for providing a plurality of external signals to the plurality of packages 1200, respectively.

Figure 15:
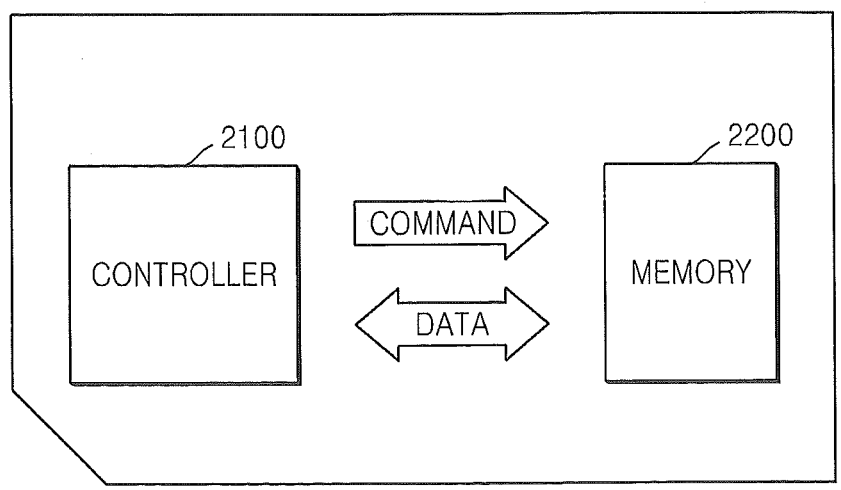
FIG. 15 is a schematic block diagram of a memory card that includes a memory device according to embodiments of the inventive concept.

FIG. 15 is a schematic block diagram of a memory module 2000 that includes a memory device according to an embodiment of the inventive concept.

In the memory card 2000, a controller 2100 and a memory 2200 are disposed so as to exchange an electrical signal with each other. For example, if the controller 2100 transmits a command to the memory 2200, then the memory 2200 may transmit data to the controller 2100.

The memory 2200 may include one of memory devices according to various embodiments of the inventive concept. In particular, the memory 2200 may have the structural characteristics of at least one selected from among the memory devices according to the previous embodiments of the inventive concept.

Examples of the memory card 2000 include a memory stick card, a smart media (SM) card, a secure digital (SD) card, a mini-secure digital (SD) card, and a multimedia card (MMC).

Figure 16:
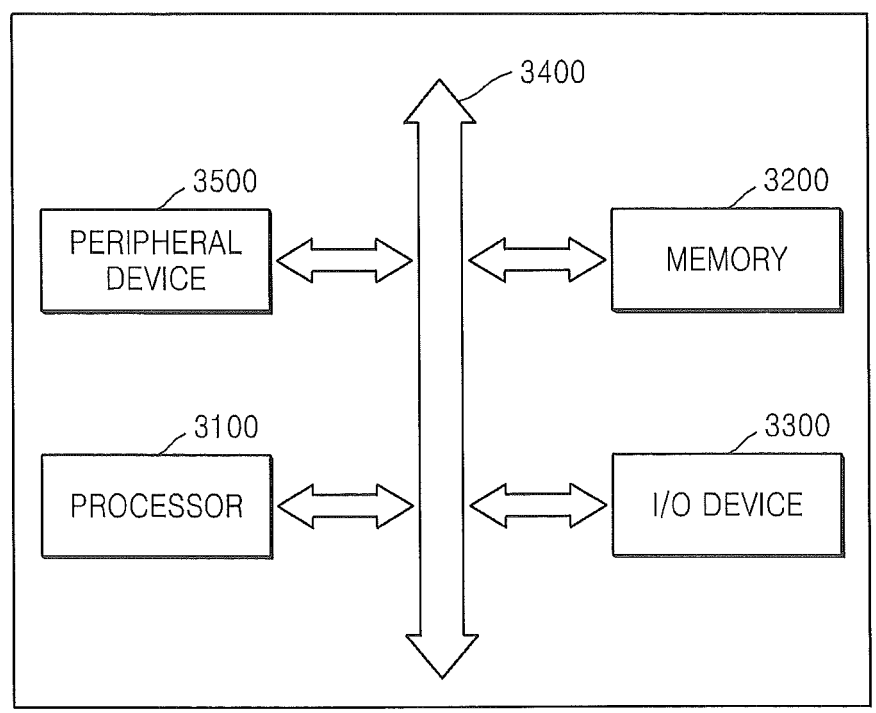
FIG. 16 is a schematic block diagram of a system that includes a memory device according to embodiments of the inventive concept.

FIG. 16 is a schematic block diagram of a system 3000 that includes a memory device according to an embodiment of the inventive concept.

In the system 3000, a processor 3100, a memory device 3200, and an input/output (I/O) device 3300 may establish data communication with one another via a bus 3400.

The memory device 3200 of the system 3000 may include a random access memory (random access memory) and a read-only memory (ROM). The system 3000 may further include a peripheral device 3500, such as a floppy disk drive and a compact disk (CD) ROM drive.

The memory 3200 may include one of semiconductor memory devices according to various embodiments of the inventive concept. In particular, the memory 3200 may have the structural characteristics of at least one selected from among the semiconductor memory devices according to the previous embodiments of the inventive concept.

The memory device 3200 may store code and data for operating the processor 3100.

The system 3000 may be applied to mobile phones, MP3 players, navigators, portable multimedia players (PMPs), solid state disks (SSDs), or household appliances.

FIGS. 17A-17D are cross-sectional views illustrating a conventional method of fabricating a memory device, and a device so fabricated. The same or similar elements as described above with reference to FIGS. 4A-4G will not be described again here.

Figure 17A:
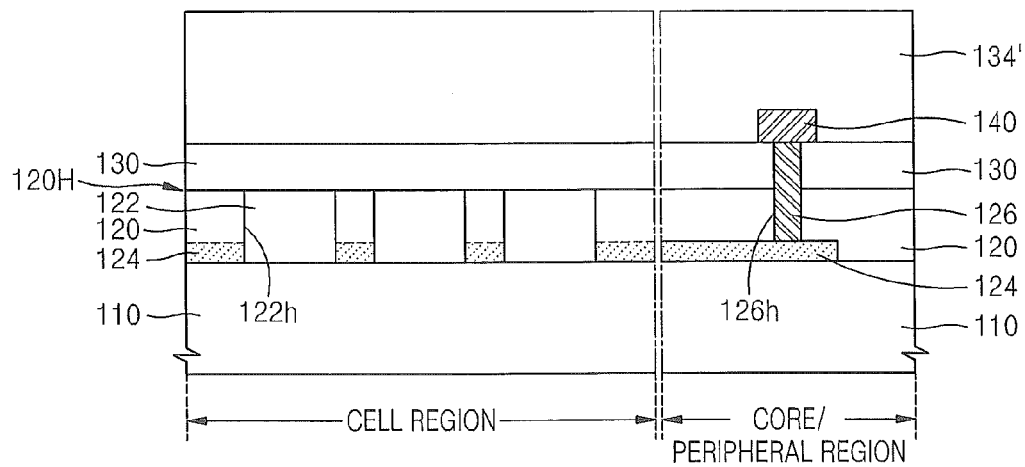
FIGS. 17A-17D are cross-sectional views illustrating a conventional method of fabricating a memory device and a device so fabricated.

Specifically, referring to FIG. 17A, the structure of FIG. 4A is fabricated. However, the exposed insulating layer 130 is not etched and removed by using the core/peripheral bit line 140 as an etch mask, as was illustrated in FIG. 4B. Rather, as shown in FIG. 17A, the insulating layer 130 remains intact, and a first insulating molding layer 134' is formed thickly on the entire semiconductor substrate 110 and is then planarized using CMP.

Figure 17B:
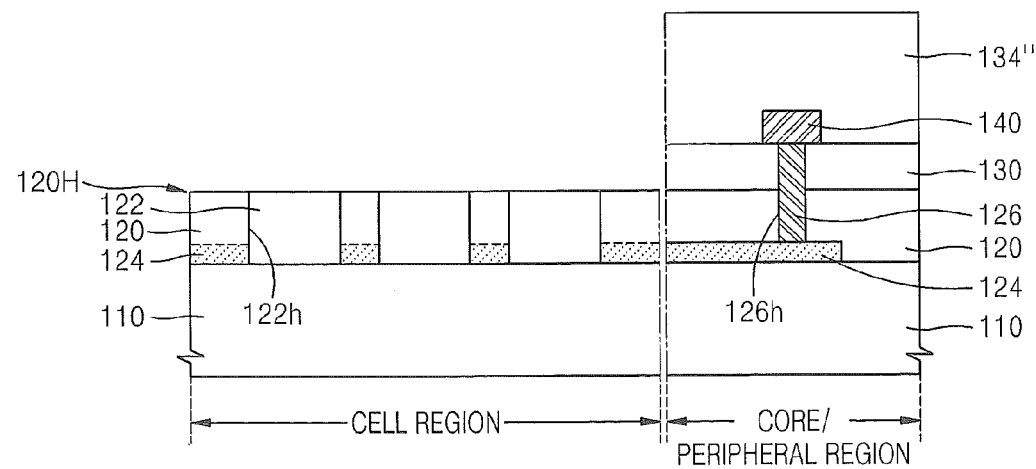

Then, referring to FIG. 17B, a photolithography and etch process is used to remove the first insulating molding layer 134' from the cell region, so that the first insulating molding layer 134'' only remains in the core/peripheral region. The etch process may also etch through the insulating layer 130 on the cell region, so as to expose the BC layers 122 in the cell region.

Figure 17C:
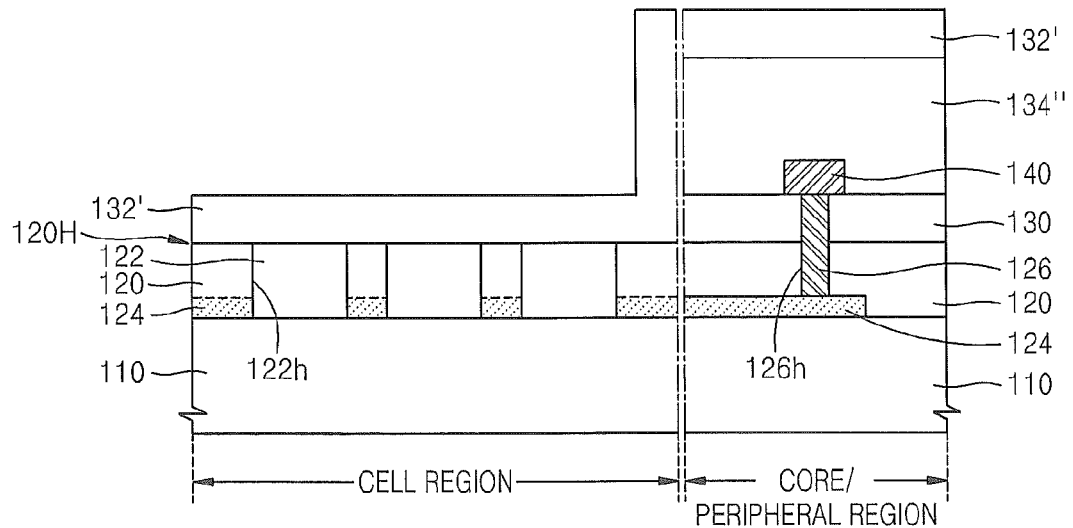

Referring now to FIG. 17C, a stepped stopper layer 132' is formed on the flat surface 120H of the interlayer insulating layer 120, on the exposed BC layers 122 in the cell region, and on the first insulating molding layer 134'' that remains on the core/peripheral region.

Figure 17D:
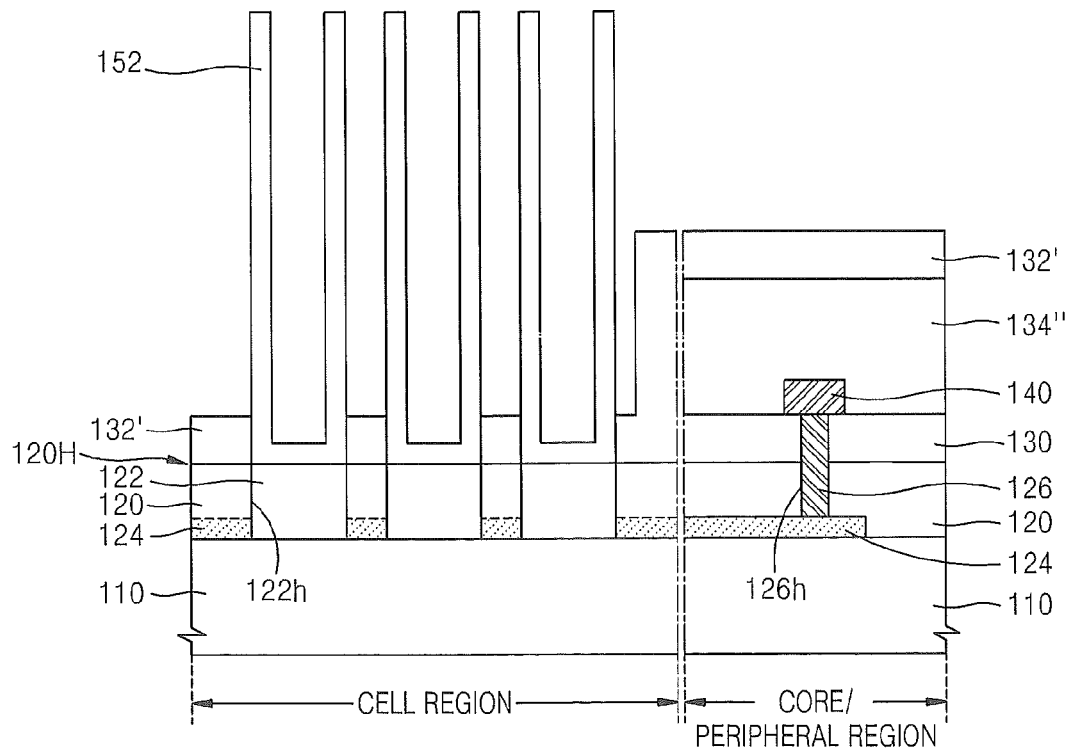

Finally, referring to FIG. 17D, an additional photolithography step is used on the stepped stopper layer 132' to again expose the BC layers 122. Prior to performing this photolithography step, a mold oxide layer may be thickly formed on the entire surface of the stepped stopper layer 132' and planarized. In this case, both the mold oxide layer and the stepped stopper layer 132' may be etched to define the storage node contact holes and expose BC layers 122. Storage nodes 152 may then be fabricated as was described, for example, in FIG. 4G.

Accordingly, comparing conventional fabrication processes of FIGS. 17A-17D with, for example, embodiments of FIGS. 4A-4G, a flat stopper layer 136 is not provided in embodiments of FIGS. 17A-17D. Moreover, steps for forming the first insulating molding layer 134' (as illustrated in FIG. 17A) and for opening up the cell region (as illustrated in FIG. 17B) are employed. Finally, a stepped stopper as illustrated in FIG. 17C is employed. In contrast, various embodiments described herein need not open up the cell region as illustrated in FIG. 17B, and need not provide a stepped stopper layer, as illustrated in FIG. 17C.

Other conventional memory device fabrication processes may use two stopper layers in the cell array region, as described, for example, in U.S. Patent Application Publication 2002/0047201 to Suzuki and U.S. Patent Application Publication 2005/0153518 to You et al. However, flat and stepped stoppers as described by various embodiments herein, are not used.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A memory device comprising:
   a microelectronic substrate including a cell array region and a peripheral region adjacent the cell array region, the cell array region including therein an array of memory cells and the peripheral region including therein a plurality of peripheral circuits for the array of memory cells, the microelectronic substrate including a lower layer that extends across the cell array region and across the peripheral region and that includes a flat outer surface from the cell array region to the peripheral region;
   a signal transfer conductor layer that extends in the cell array region beneath the flat outer surface of the lower layer and that extends in the peripheral region above the flat outer surface of the lower layer;
   an insulating layer on the lower layer, the insulating layer extending across the cell array region and the peripheral region and also including a flat outer surface from the cell array region to the peripheral region;
   a flat stopper layer on the flat outer surface of the insulating layer and extending across the cell array region and the peripheral region; and
   an array of memory cell capacitor storage nodes in the cell array region that extend beyond the flat stopper layer and that penetrate through the flat stopper layer and the insulating layer.

2. A memory device according to claim 1 further comprising:
a stepped stopper layer that extends along the cell array region on the outer surface of the lower layer and that extends onto the signal transfer conductor layer in the peripheral region.

3. A memory device according to claim 2 wherein a portion of the stepped stopper layer that extends onto the signal transfer conductor layer in the peripheral region directly contacts the flat stopper layer.

4. A memory device according to claim 2:
wherein the stepped stopper layer extends onto sidewalls of the signal transfer conductor layer in the peripheral region but not onto an outer surface of the signal transfer layer in the peripheral region; and
wherein the flat stopper layer extends directly on the outer surface of the signal transfer layer.

5. A memory device according to claim 1 wherein the flat stopper layer extends directly on an outer surface of the signal transfer layer.

6. A memory device according to claim 1 wherein the signal transfer conductor layer further comprises a plurality of contact plugs, a respective one of which connects a respective portion of the signal transfer conductor layer that extends in the cell array region to a respective portion of the signal transfer conductor layer that extends in the peripheral region.

7. A memory device according to claim 6 wherein a respective signal transfer conductor layer in the peripheral region is wider than a respective contact plug that is connected thereto, the memory device further comprising a layer that extends along a sidewall of the respective contact plug to an underside of the respective signal transfer conductor layer in the peripheral region.

8. A memory device according to claim 1 wherein portions of the array of memory cell capacitor storage nodes that extend beyond the insulating layer are of cylindrical shape and portions of the array of memory cell capacitor storage nodes that penetrate through the flat stopper layer and the insulating layer are of concave shape.

9. A memory device according to claim 1 wherein the lower layer comprises the semiconductor substrate itself and/or an insulating layer on the semiconductor substrate.

10. A memory device according to claim 1 further comprising a plurality of buried contacts, a respective one of which connects a lower surface of a memory cell capacitor storage electrode with the signal transfer conductor layer in the cell array region.

11. A memory device according to claim 1 wherein the signal transfer conductor layer that extends in the cell array region comprises a plurality of cell array region bit lines and wherein the signal transfer conductor layer that extends in the peripheral region comprises a plurality of peripheral region bit lines.

12. A memory device according to claim 1 wherein the signal transfer conductor layer that extends in the cell array region comprises a plurality of cell array region word lines and wherein the signal transfer conductor layer that extends in the peripheral region comprises a plurality of peripheral region word lines.

13. A memory device according to claim 1 further comprising a plurality of cell transistors in the cell array region that are connected to the signal transfer conductor layer that extends in the cell array region.

14. A memory device according to claim 13 wherein the cell transistors comprise vertical channel transistors.

15. A memory device according to claim 1 in combination with a mounting substrate on which the memory device is mounted.

16. A memory device according to claim 15 in further combination with a memory controller on the substrate to provide a memory card.

17. A memory device according to claim 1 in combination with a bus that is connected to the memory device; and a peripheral device, a processor and/or an input/output device connected to the bus.

18. A memory device comprising:
a microelectronic substrate including a cell array region and a peripheral region adjacent the cell array region, the cell array region including therein an array of memory cells, a respective one of which includes at least one transistor and at least one capacitor, and the peripheral region including therein a plurality of peripheral circuits for the array of memory cells;
an interlayer insulating layer on the semiconductor substrate, that extends across the cell array region and across the peripheral region and that includes a flat outer surface from the cell array region to the peripheral region;
a buried contact layer in the interlayer insulating layer in the cell array region, and electrically connected to a first source/drain region of the at least one transistor;
a cell array bit line that is electrically connected to a second source/drain region of the at least one transistor in the cell array region;
a peripheral bit line on the outer surface of the interlayer insulating layer in the core/peripheral region, remote from the microelectronic substrate, and electrically connected to the cell array bit line;
an insulating layer between the peripheral bit line and the interlayer insulating layer in a pattern corresponding to the peripheral bit line;
a stepped stopper layer that extends along the cell array region on the interlayer insulating layer and that extends along the peripheral region on the interlayer insulating layer and on the peripheral bit line;
an insulating molding layer on the stepped stopper layer, the insulating molding layer extending across the cell array region and the peripheral region and also including a flat outer surface from the cell array region to the peripheral region;
a flat stopper layer on the insulating molding layer; and
a storage electrode of the at least one capacitor, which is connected to the buried contact layer while passing through the stepped stopper layer, the insulating molding layer and the flat stopper layer.

19. A memory device according to claim 18, wherein a lower surface of the peripheral bit line is farther from the substrate than a lower surface of the storage electrode.

20. A memory device according to claim 18, wherein the flat stopper layer and the stepped stopper layer directly contact each other over the peripheral bit line.

21. A memory device according to claim 18, wherein the peripheral bit line and the stepped stopper layer directly contact each other.

22. A memory device according to claim 18, wherein the storage electrode has a cylindrical shape on the flat stopper layer and a concave shape between the stepped stopper layer and the flat stopper layer.

* * * * *